US010439050B2

(12) United States Patent
Sakata

(10) Patent No.: US 10,439,050 B2
(45) Date of Patent: *Oct. 8, 2019

(54) METHOD FOR MANUFACTURING TRANSISTOR

(71) Applicant: Semiconductor Energy Laboratory Co., Ltd., Atsugi-shi, Kanagawa-ken (JP)

(72) Inventor: Junichiro Sakata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/461,767

(22) Filed: Mar. 17, 2017

(65) Prior Publication Data

US 2017/0194465 A1 Jul. 6, 2017

Related U.S. Application Data

(60) Division of application No. 14/454,126, filed on Aug. 7, 2014, now Pat. No. 9,601,601, which is a continuation of application No. 13/473,637, filed on May 17, 2012, now Pat. No. 8,803,149, which is a continuation of application No. 12/634,096, filed on Dec. 9, 2009, now Pat. No. 8,183,099.

(30) Foreign Application Priority Data

Dec. 19, 2008 (JP) .................................. 2008-323725

(51) Int. Cl.
*H01L 29/66* (2006.01)
*H01L 21/02* (2006.01)
(Continued)

(52) U.S. Cl.
CPC .. *H01L 29/66969* (2013.01); *H01L 21/02565* (2013.01); *H01L 21/02631* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101258607 A 9/2008
CN 101401213 A 4/2009
(Continued)

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.
(Continued)

*Primary Examiner* — Khaja Ahmad
(74) *Attorney, Agent, or Firm* — Robinson Intellectual Property Law Office; Eric J. Robinson

(57) ABSTRACT

A hydrogen barrier layer is selectively provided over an oxide semiconductor layer including hydrogen and hydrogen is selectively desorbed from a given region in the oxide semiconductor layer by conducting oxidation treatment, so that regions with different conductivities are formed in the oxide semiconductor layer. After that, a channel formation region, a source region, and a drain region can be formed with the use of the regions with different conductivities formed in the oxide semiconductor layer.

16 Claims, 26 Drawing Sheets

(51) Int. Cl.
*H01L 21/66* (2006.01)
*H01L 29/786* (2006.01)
*H01L 27/12* (2006.01)
*H01L 29/417* (2006.01)

(52) U.S. Cl.
CPC ........ *H01L 21/02664* (2013.01); *H01L 22/12* (2013.01); *H01L 27/1225* (2013.01); *H01L 29/41733* (2013.01); *H01L 29/7869* (2013.01); *H01L 29/78618* (2013.01); *H01L 21/02554* (2013.01)

(56) References Cited

U.S. PATENT DOCUMENTS

| | | |
|---|---|---|
| 5,847,410 A | 12/1998 | Nakajima |
| 6,211,533 B1 | 4/2001 | Byun et al. |
| 6,294,274 B1 | 9/2001 | Kawazoe et al. |
| 6,464,750 B1 | 10/2002 | Tailhades et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,852,623 B2 | 2/2005 | Park et al. |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,884,360 B2 | 2/2011 | Takechi et al. |
| 7,935,582 B2 | 5/2011 | Iwasaki |
| 7,956,361 B2 | 6/2011 | Iwasaki |
| 8,003,981 B2 | 8/2011 | Iwasaki et al. |
| 8,053,773 B2 | 11/2011 | Shin et al. |
| 8,129,718 B2 | 3/2012 | Hayashi et al. |
| 8,154,024 B2 | 4/2012 | Iwasaki |
| 8,193,045 B2 | 6/2012 | Omura et al. |
| 8,420,442 B2 | 4/2013 | Takechi et al. |
| 8,426,243 B2 | 4/2013 | Hayashi et al. |
| 8,445,937 B2 | 5/2013 | Carcia et al. |
| 8,889,480 B2 | 11/2014 | Takechi et al. |
| 9,209,026 B2 | 12/2015 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0230752 A1 | 10/2005 | Kanno et al. |
| 2006/0027805 A1 | 2/2006 | Koo et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0275926 A1 | 12/2006 | Carcia et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0069209 A1 | 3/2007 | Jeong et al. |
| 2007/0072439 A1 | 3/2007 | Akimoto et al. |
| 2007/0077721 A1 | 4/2007 | Kanaya |
| 2007/0087487 A1 | 4/2007 | Honda |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0262318 A1 | 11/2007 | Shoji et al. |
| 2007/0272922 A1 | 11/2007 | Kim et al. |
| 2007/0275181 A1 | 11/2007 | Carcia et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0067508 A1 | 3/2008 | Endo et al. |
| 2008/0073653 A1 | 3/2008 | Iwasaki |
| 2008/0073684 A1 | 3/2008 | Hidaka et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0272370 A1 | 11/2008 | Endo et al. |
| 2008/0291350 A1 | 11/2008 | Hayashi et al. |
| 2008/0296568 A1 | 12/2008 | Ryu et al. |
| 2008/0299702 A1* | 12/2008 | Son .................... H01L 29/7869 438/104 |
| 2008/0303020 A1* | 12/2008 | Shin .................. H01L 29/66742 257/43 |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0045397 A1* | 2/2009 | Iwasaki ............. H01L 29/78693 257/43 |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140243 A1* | 6/2009 | Kim .................. H01L 21/02614 257/43 |
| 2009/0152506 A1 | 6/2009 | Umeda et al. |
| 2009/0152541 A1 | 6/2009 | Maekawa et al. |
| 2009/0184326 A1 | 7/2009 | Lee et al. |

(56) References Cited

U.S. PATENT DOCUMENTS

| | | | |
|---|---|---|---|
| 2009/0239335 A1 | 9/2009 | Akimoto et al. | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0092800 A1 | 4/2010 | Itagaki et al. | |
| 2010/0109002 A1 | 5/2010 | Itagaki et al. | |
| 2010/0140612 A1 | 6/2010 | Omura et al. | |
| 2011/0042670 A1* | 2/2011 | Sato | H01L 29/78621 257/43 |
| 2011/0256684 A1 | 10/2011 | Iwasaki et al. | |
| 2012/0052636 A1 | 3/2012 | Shin et al. | |
| 2013/0207106 A1 | 8/2013 | Hayashi et al. | |

FOREIGN PATENT DOCUMENTS

| | | |
|---|---|---|
| EP | 1443130 A | 8/2004 |
| EP | 1737044 A | 12/2006 |
| EP | 1770790 A | 4/2007 |
| EP | 2159844 A | 3/2010 |
| EP | 2226847 A | 9/2010 |
| EP | 2339639 A | 6/2011 |
| EP | 1984954 B1 | 10/2011 |
| EP | 2816607 A | 12/2014 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-016249 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-039172 A | 2/2005 |
| JP | 2007-096055 A | 4/2007 |
| JP | 2007-103918 A | 4/2007 |
| JP | 2007-123861 A | 5/2007 |
| JP | 2007-516347 | 6/2007 |
| JP | 2007-220816 A | 8/2007 |
| JP | 2007-250983 A | 9/2007 |
| JP | 2007-311404 A | 11/2007 |
| JP | 2008-042088 A | 2/2008 |
| JP | 2008-072025 A | 3/2008 |
| JP | 2008-294136 A | 12/2008 |
| JP | 2010-080936 A | 4/2010 |
| KR | 2008-0104756 A | 12/2008 |
| WO | WO-2004/105149 | 12/2004 |
| WO | WO-2004/114391 | 12/2004 |
| WO | WO-2007/029844 | 3/2007 |
| WO | WO-2007/119386 | 10/2007 |
| WO | WO-2008/105347 | 9/2008 |
| WO | WO-2008/149873 | 12/2008 |

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

International Search Report (Application No. PCT/JP2009/070357) dated Dec. 28, 2009.

Written Opinion (Application No. PCT/JP2009/070357) dated Dec. 28, 2009.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et at., "Full-Functional System Liquid Crystal Display Using CG-Silicon Technology", SID Digest '04 : SID International Symposium Digest of Technical Papers, 2004, vol. 35, pp. 860-863.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layers", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AMOLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68:3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. 8), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 ; SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physics Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Chinese Office Action (Application no. 200980150717.1) dated Nov. 5, 2012.

Taiwanese Office Action (Application No. 104112387) dated Oct. 21, 2016.

* cited by examiner

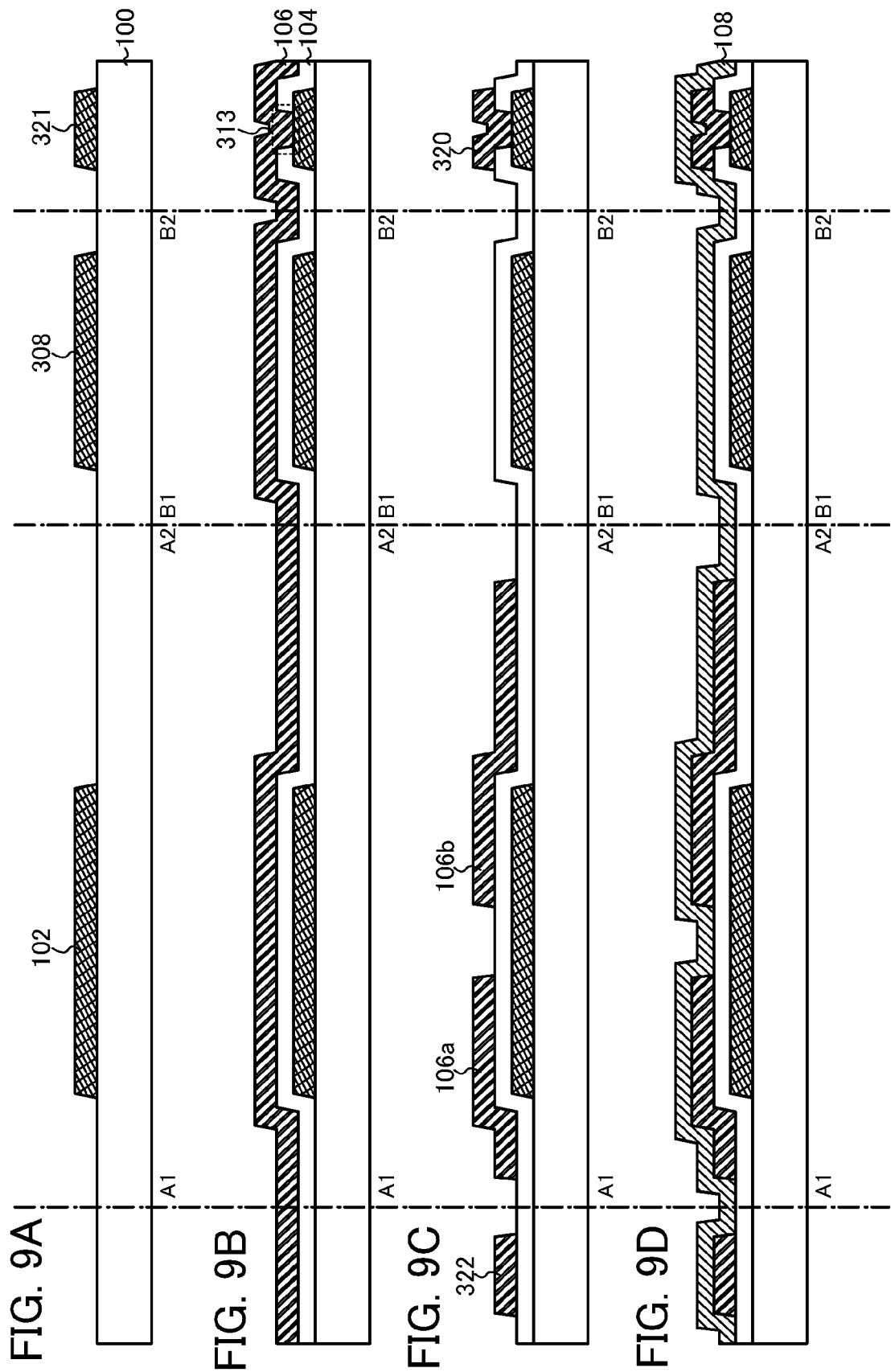

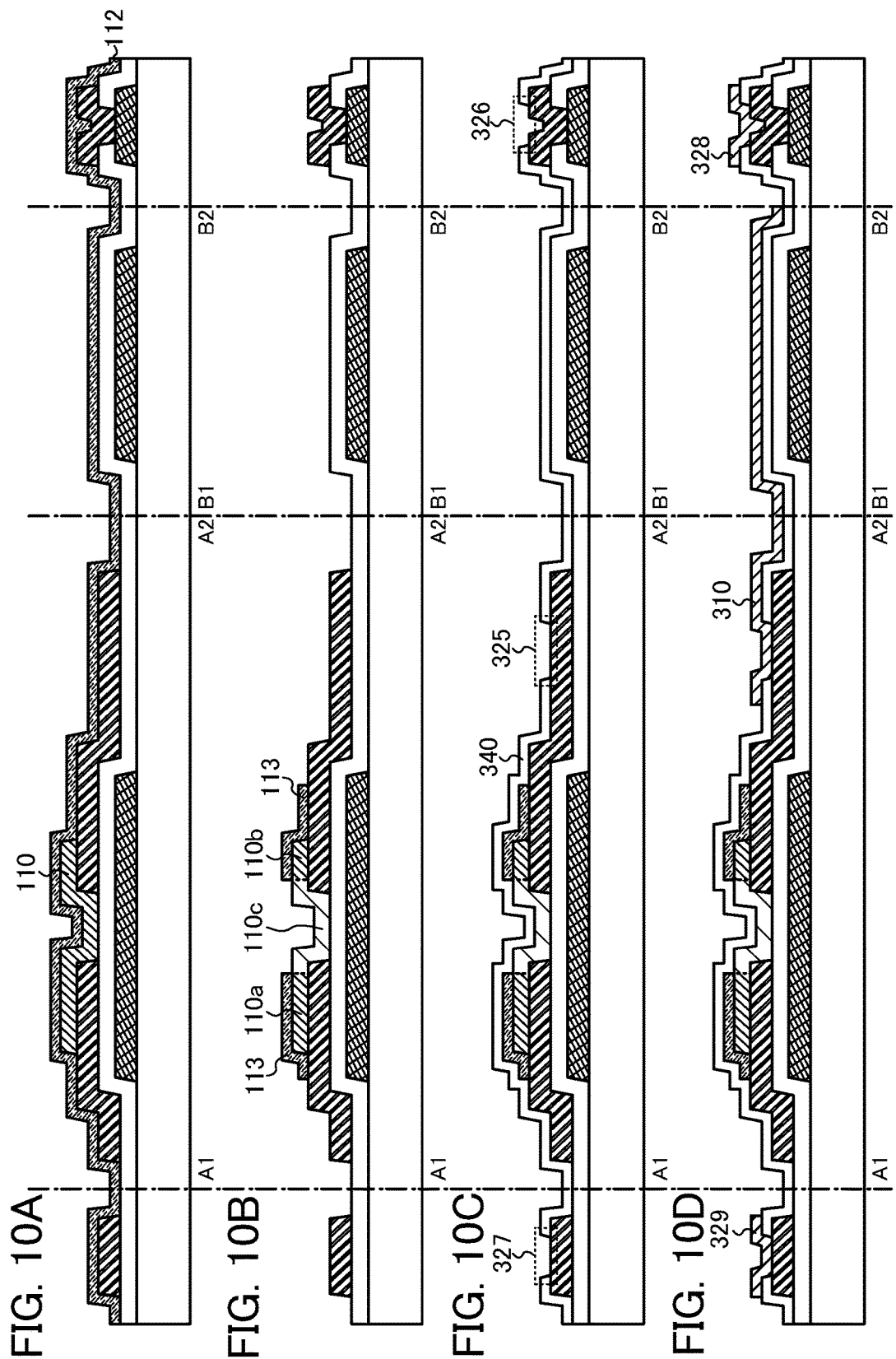

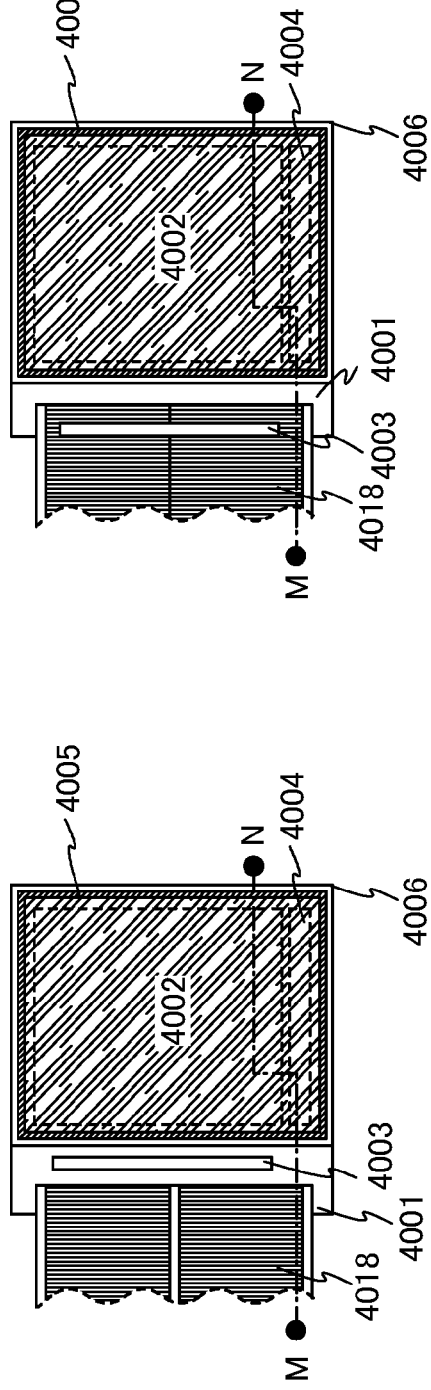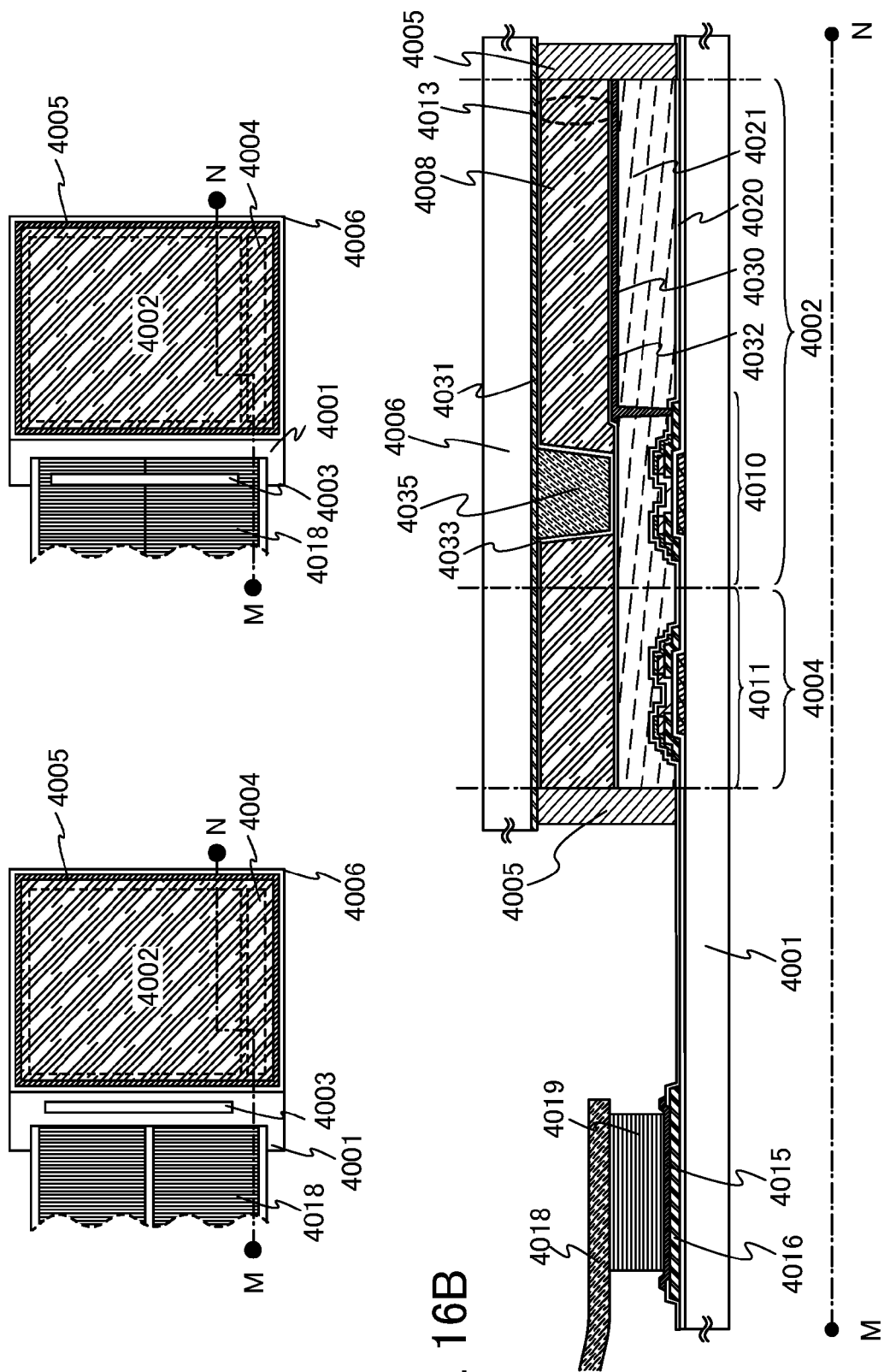

METHOD FOR MANUFACTURING TRANSISTOR

TECHNICAL FIELD

The present invention relates to a method for manufacturing a transistor using an oxide semiconductor layer, and also relates to a method for manufacturing a semiconductor device including the transistor.

BACKGROUND ART

Various metal oxides are used for a variety of applications. Indium oxide is a well-known material and is used as a transparent electrode material which is necessary for liquid crystal displays and the like.

Some metal oxides have semiconductor characteristics. Metal oxides having semiconductor characteristics are a kind of compound semiconductor. The compound semiconductor is a semiconductor formed using two or more kinds of atoms bonded together. In general, metal oxides become insulators. However, it is known that metal oxides become semiconductors depending on the combination of elements included in the metal oxides.

For example, it is known that tungsten oxide, tin oxide, indium oxide, zinc oxide, and the like are metal oxides which have semiconductor characteristics. A thin film transistor in which a transparent semiconductor layer which is formed using such a metal oxide serves as a channel formation region is disclosed (Patent Documents 1 to 4 and Non-Patent Document 1).

Further, not only one-element oxides but also multi-element oxides are known as metal oxides. For example, $InGaO_3(ZnO)_m$ (m is a natural number) which is a homologous compound is a known material (Non-Patent Documents 2 to 4).

Furthermore, it is confirmed that such an In—Ga—Zn-based oxide is applicable to a channel layer of a thin film transistor (also referred to as a "TFT") (Patent Document 5 and Non-Patent Documents 5 and 6).

In addition, a method for manufacturing a transistor using an oxide semiconductor in which the electric resistance of the oxide semiconductor is reduced by making the oxide semiconductor include hydrogen is proposed. For example, in Patent Document 6, a method in which hydrogen is added to a source electrode and a drain electrode and hydrogen included in the source electrode and the drain electrode is diffused into an oxide semiconductor is disclosed.

REFERENCE

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Patent Document 6] Japanese Published Patent Application No. 2008-72025
[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor", Appl. Phys. Lett., 17 Jun. 1996, Vol. 68, p. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, p. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", J. Solid State Chem., 1995, Vol. 116, p. 170-178
[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", KOTAI BUTSURI (SOLID STATE PHYSICS), 1993, Vol. 28, No. 5, p. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, p. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, p. 488-492

DISCLOSURE OF INVENTION

However, it is difficult to lower resistance by diffusing hydrogen along a thickness direction of an oxide semiconductor (to a surface which is opposite to a surface in contact with a source electrode and a drain electrode of the oxide semiconductor) when hydrogen is diffused into the oxide semiconductor from the source electrode and the drain electrode. In addition, there is a problem in that distribution of hydrogen concentration in a plane direction of an oxide semiconductor layer (a direction parallel to a substrate) depends on shapes of the source electrode and the drain electrode.

In view of the above problems, it is an object of the present invention to provide a method for forming regions with different conductivities in given regions in an oxide semiconductor layer in a transistor including the oxide semiconductor layer.

According to an embodiment of the present invention, a hydrogen barrier layer is selectively provided over an oxide semiconductor layer including hydrogen and hydrogen is selectively desorbed from a given region in the oxide semiconductor layer by conducting oxidation treatment so that regions with different conductivities are formed in the oxide semiconductor layer. With the use of the regions with different conductivities formed in the oxide semiconductor layer, a channel formation region, a source region, and a drain region can be formed. In this case, hydrogen is included in the oxide semiconductor layer in advance, so that variations in conductivity between the source region and the drain region, which are provided in the oxide semiconductor layer, can be reduced. In addition, a position where the hydrogen barrier layer is provided is controlled, so that the regions with different conductivities can be formed appropriately in the oxide semiconductor layer.

According to another embodiment of the present invention, an oxide semiconductor layer including hydrogen is formed; a hydrogen barrier layer is selectively formed over the oxide semiconductor layer so that at least part of the oxide semiconductor layer is exposed; hydrogen is selectively desorbed from the oxide semiconductor layer by conducting oxidation treatment so that a first region and a second region which includes less hydrogen than the first region are formed in the oxide semiconductor layer; a channel formation region is formed using the second region; and a source region and a drain region are formed using the first region.

According to another embodiment of the present invention, a gate electrode is formed over a substrate; a gate insulating layer is formed over the gate electrode; a source electrode layer and a drain electrode layer are formed over the gate insulating layer; an oxide semiconductor layer including hydrogen is formed over the source electrode layer and the drain electrode layer; a hydrogen barrier layer is formed over the oxide semiconductor layer; the hydrogen bather layer is etched so that the hydrogen barrier layers are left over at least parts of the oxide semiconductor layer, which are formed over the source electrode layer and the drain electrode layer and a surface of part of the oxide semiconductor layer, which is formed in a region located over the gate electrode and between the source electrode layer and the drain electrode layer, is exposed; and oxidation treatment is conducted to selectively desorb hydrogen from the oxide semiconductor layer so that in the oxide semiconductor layer, a region whose surface is exposed includes less hydrogen than regions located under the hydrogen barrier layers.

According to another embodiment of the present invention, a gate electrode is formed over a substrate; a gate insulating layer is formed over the gate electrode; a source electrode layer and a drain electrode layer are formed over the gate insulating layer; an oxide semiconductor layer including hydrogen is formed over the source electrode layer and the drain electrode layer; a hydrogen barrier layer is formed over the oxide semiconductor layer; the hydrogen barrier layer is etched so that the hydrogen barrier layers are left over at least parts of the oxide semiconductor layer, which are formed over the source electrode layer and the drain electrode layer and over part of the oxide semiconductor layer, which is formed in a region located over the gate electrode and between the source electrode layer and the drain electrode layer and a surface of part of the oxide semiconductor layer, which is formed in the region located over the gate electrode and between the source electrode layer and the drain electrode layer, is exposed; and oxidation treatment is conducted to selectively desorb hydrogen from the oxide semiconductor layer so that in the oxide semiconductor layer, a region whose surface is exposed includes less hydrogen than regions located under the hydrogen barrier layers.

According to another embodiment of the present invention, a gate electrode is formed over a substrate; a gate insulating layer is formed over the gate electrode; an oxide semiconductor layer including hydrogen is formed over the gate insulating layer; a hydrogen barrier layer is formed over the oxide semiconductor layer; the hydrogen barrier layer is etched so that at least a surface of part of the oxide semiconductor layer, which is located over the gate electrode, is exposed; and oxidation treatment is conducted to selectively desorb hydrogen from the oxide semiconductor layer so that in the oxide semiconductor layer, a region whose surface is exposed includes less hydrogen than regions located under the hydrogen barrier layers.

According to another embodiment of the present invention, a source electrode layer and a drain electrode layer are formed over a substrate; an oxide semiconductor layer including hydrogen is formed over the source electrode layer and the drain electrode layer; a hydrogen barrier layer is formed over the oxide semiconductor layer; the hydrogen barrier layer is etched so that the hydrogen barrier layers are left over at least parts of the oxide semiconductor layer, which are formed over the source electrode layer and the drain electrode layer and a surface of part of the oxide semiconductor layer, which is formed in the region located between the source electrode layer and the drain electrode layer, is exposed; oxidation treatment is conducted to selectively desorb hydrogen from the oxide semiconductor layer so that in the oxide semiconductor layer, a region whose surface is exposed includes less hydrogen than regions located under the hydrogen barrier layers; a gate insulating layer is formed over the oxide semiconductor layer; and a gate electrode is formed in a region located between the source electrode layer and the drain electrode layer and over the gate insulating layer.

According to another embodiment of the present invention, a source electrode layer and a drain electrode layer are formed over a substrate; an oxide semiconductor layer including hydrogen is formed over the source electrode layer and the drain electrode layer; a hydrogen barrier layer is formed over the oxide semiconductor layer; the hydrogen barrier layer is etched so that the hydrogen barrier layers are left over at least parts of the oxide semiconductor layer, which are formed over the source electrode layer and the drain electrode layer and over part of the oxide semiconductor layer, which is formed in a region located between the source electrode layer and the drain electrode layer and a surface of the part of the oxide semiconductor layer, which is formed in the region located between the source electrode layer and the drain electrode layer, is exposed; oxidation treatment is conducted to selectively desorb hydrogen from the oxide semiconductor layer so that in the oxide semiconductor layer, a region whose surface is exposed includes less hydrogen than regions located under the hydrogen barrier layers; a gate insulating layer is formed over the oxide semiconductor layer; and a gate electrode is formed in a region located between the source electrode layer and the drain electrode layer and over the gate insulating layer.

Note that as an example of the oxide semiconductor which can be used in this specification, there is an oxide semiconductor represented by $InMO_3 (ZnO)_m$ (m>0, m is not limited to an integer). Here, M denotes one or more metal elements selected from gallium (Ga), iron (Fe), nickel (Ni), manganese (Mn), and cobalt (Co). For example, the case where Ga is selected as M includes the case where Ga and the above metal element other than Ga, such as Ni or Fe, are selected, as well as the case where only Ga is used. In the above oxide semiconductor, there is an oxide semiconductor which includes a transition metal element such as Fe or Ni, or an oxide of the transition metal as an impurity element, in addition to the metal element included as M. In this specification, of the above oxide semiconductors, an oxide semiconductor including at least gallium as M is referred to as an In—Ga—Zn—O-based oxide semiconductor, and a thin film using the material is referred to as an In—Ga—Zn—O-based non-single-crystal film in some cases.

In this specification, silicon oxynitride means a substance which contains more oxygen than nitrogen and, in the case where measurements are conducted by rutherford backscattering spectrometry (RBS) and hydrogen forwardscattering spectrometry (HFS), silicon oxynitride preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively.

Further, silicon nitride oxide means a substance which contains more nitrogen than oxygen, and in the case where measurements are conducted using RBS and HFS, silicon nitride oxide preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Note that in this specification, semiconductor devices refer to all devices which can function by utilizing semiconductor characteristics, and display devices, semiconductor circuits, and electronic devices are all included in the category of the semiconductor devices. In addition, in this specification, the display devices include light-emitting devices and liquid crystal display devices. The light-emitting devices include light-emitting elements, and the liquid crystal display devices include liquid crystal elements. The light-emitting elements refer to elements whose luminance is controlled by a current or a voltage. Specifically, the light-emitting elements refer to inorganic electroluminescence (EL) elements, organic EL elements, and the like.

A hydrogen barrier layer is selectively provided over an oxide semiconductor layer including hydrogen and oxidation treatment is conducted in order to selectively desorb hydrogen from the oxide semiconductor layer, so that regions with different conductivities can be formed in given regions in an oxide semiconductor layer.

BRIEF DESCRIPTION OF DRAWINGS

In the accompanying drawings:

FIGS. 9A to 9D are drawings illustrating an example of a method for manufacturing a semiconductor device according to Embodiment 5;

FIGS. 10A to 10D are drawings illustrating an example of a method for manufacturing a semiconductor device according to Embodiment 5;

FIGS. 16A1 and 16A2 and FIG. 16B are drawings illustrating examples of a semiconductor device according to Embodiment 6;

BEST MODE FOR CARRYING OUT THE INVENTION

Figure 1A:
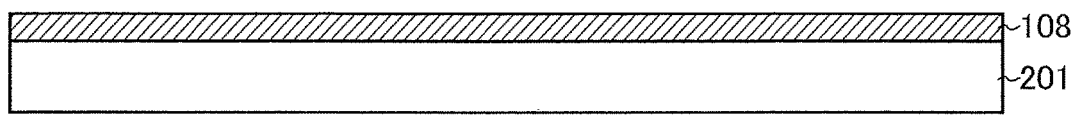
FIGS. 1A to 1D are drawings illustrating an example of a method for manufacturing a transistor according to Embodiment 1.

Embodiments of the present invention will be described below with reference to the accompanying drawings. Note that the present invention is not limited to the following description of the embodiments, and it is readily appreciated by those skilled in the art that modes and details of the present invention can be modified in a variety of ways without departing from the spirit and scope of the present invention. In addition, any of structures according to different embodiments can be combined with each other as appropriate. Note that in the structure of the present invention described below, reference numerals indicating the same portions and portions having a similar function are used in common in different drawings, and repeated descriptions thereof are omitted.

(Embodiment 1)

In this embodiment, an example of a method for manufacturing a transistor is described with reference to drawings.

First, an oxide semiconductor layer 108 including hydrogen is formed over a substrate 201 (see FIG. 1A).

The oxide semiconductor layer 108 can be formed using a material of which electric resistance is lowered by addition of hydrogen or deuterium. For example, the oxide semiconductor layer 108 can be formed using an oxide semiconductor including at least indium, zinc, gallium, and hydrogen. In this case, deposition is performed by a sputtering method using an oxide semiconductor target including In, Ga, and Zn (for example, $In_2O_3:Ga_2O_3:ZnO=1:1:1$) while a hydrogen gas is introduced, so that the oxide semiconductor layer 108 including hydrogen can be formed.

The oxide semiconductor layer 108 is formed while hydrogen is introduced into a deposition atmosphere, so that hydrogen can be uniformly added into the oxide semiconductor layer 108 even when the oxide semiconductor layer 108 is made thick.

The conditions of sputtering can be set as follows: the distance between the substrate 201 and a target is 30 mm to 500 mm, the pressure is 0.01 Pa to 2.0 Pa, the direct current (DC) power supply is 0.25 kW to 5.0 kW, the temperature is 20° C. to 100° C., the atmosphere is a mixture atmosphere of hydrogen and argon, a mixture atmosphere of hydrogen and oxygen, or a mixture atmosphere of hydrogen, argon, and oxygen.

Instead of a hydrogen gas, water vapor, ammonia, and hydrocarbon such as alcohol may be used.

As the above sputtering method, an RF sputtering method using a high frequency power supply for a power supply for sputtering, a DC sputtering method using a DC power supply, a pulsed DC sputtering method in which a DC bias is applied in pulses, or the like can be employed.

Note that in this embodiment, the oxide semiconductor layer 108 is not limited to an In—Ga—Zn—O-based non-single-crystal film. Alternatively, the oxide semiconductor layer 108 can be formed using a material of which electric resistance is lowered by addition of hydrogen or deuterium (for example, zinc oxide (ZnO), indium zinc oxide (IZO), gallium-doped zinc oxide (GZO), or the like). Even in the case where any of these materials is used, deposition is performed while hydrogen is introduced, so that an oxide semiconductor layer including hydrogen can be formed.

In addition to the method in which hydrogen is introduced into a deposition atmosphere of the oxide semiconductor layer 108 as described above, as a method for forming an oxide semiconductor including hydrogen, hydrogen may be added to the oxide semiconductor layer 108 by hydrogen plasma treatment, an ion implantation method, an ion doping method, or the like after the oxide semiconductor layer 108 is formed.

Moreover, the oxide semiconductor layer 108 is preferably formed such that the concentration of hydrogen in the oxide semiconductor layer 108 is in the range of $1\times10^{18}$ atoms/cm$^3$ to $1\times10^{23}$ atoms/cm$^3$ before oxidation treatment.

Note that the concentration of hydrogen included in the film can be measured by secondary ion mass spectrometry (SIMS).

Figure 1B:
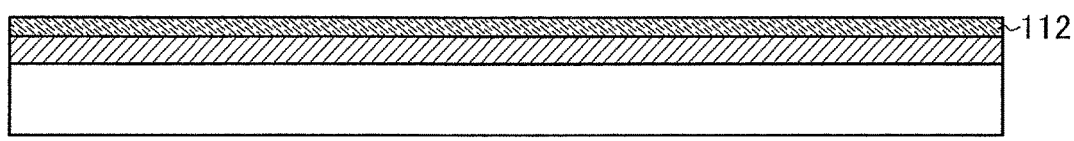

Next, a hydrogen barrier layer 112 is formed over the oxide semiconductor layer 108 (see FIG. 1B).

The hydrogen barrier layer 112 may be any film as long as it blocks hydrogen desorbed from the oxide semiconductor layer 108 in oxidation treatment such as heat treatment which is conducted later. The hydrogen barrier layer 112 can be a single-layer film selected from a silicon nitride film, a silicon nitride oxide film, a silicon oxide film, a silicon oxynitride film, an aluminum oxide film, an aluminum nitride film, an aluminum oxynitride film, a titanium oxide film, a tantalum oxide film, a titanium nitride film, and a tantalum nitride film, or a stacked-layer film including two or more layers of them, for example.

With the provision of the hydrogen barrier layer 112, desorption of hydrogen from the oxide semiconductor layer 108 located under the hydrogen barrier layer 112 can be suppressed in oxidation treatment which is conducted later.

Figure 1C:
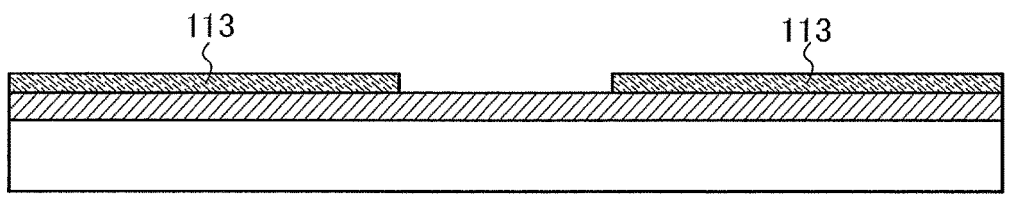

Next, the hydrogen barrier layer 112 is etched so that parts of the hydrogen barrier layer 112 (hydrogen barrier layers 113) are left and part of the oxide semiconductor layer 108 is exposed (see FIG. 1C).

Note that the hydrogen barrier layers 113 can also be selectively formed over the substrate 201 by a droplet discharge method, a screen printing method, or the like. In this case, the step for etching the hydrogen barrier layer 112 can be omitted.

Figure 1D:
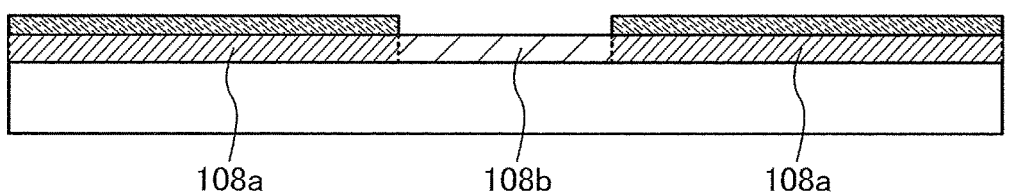

Next, hydrogen is desorbed from the oxide semiconductor layer 108 by conducting oxidation treatment, so that first regions 108a and a second region 108b which includes less hydrogen than the first regions 108a are formed in the oxide semiconductor layer 108 (see FIG. 1D). By conducting the oxidation treatment, the conductivity of the second region 108b becomes lower than the conductivities of the first regions 108a.

As the oxidation treatment, heat treatment in an oxygen atmosphere (including an air atmosphere) or in a nitrogen atmosphere, oxygen plasma treatment, or the like can be conducted. Alternatively, any of these treatments may be combined with each other. Note that heat treatment can be conducted at 150° C. to 1000° C., preferably 200° C. to 500° C.

By conducting the oxidation treatment, a large amount of hydrogen included in the oxide semiconductor layer 108 is selectively desorbed into an atmosphere from a portion (an exposed portion) of the oxide semiconductor layer 108 where the hydrogen barrier layers 113 are not formed, so that the second region 108b is formed.

Note that FIG. 1D illustrates a case where the first regions 108a which include a large amount of hydrogen are provided under the hydrogen barrier layers 113 and the second region 108b which includes a small amount of hydrogen is provided in a region where the hydrogen barrier layers 113 are not provided for convenience; however, a case where concentration gradients of hydrogen are formed between one of the first regions 108a and the second region 108b and between the other of the first regions 108a and the second region 108b is also included in this embodiment.

Figure 2A:
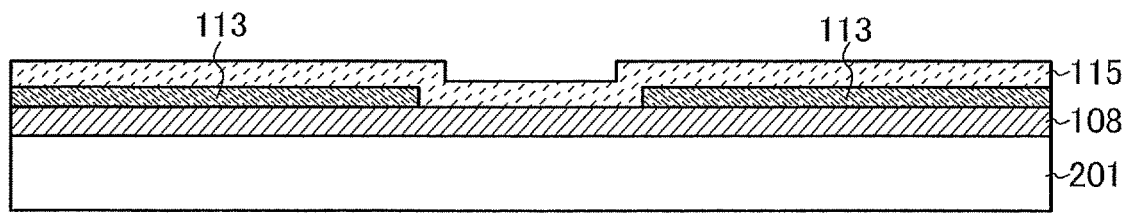
FIGS. 2A and 2B are drawings illustrating an example of a method for manufacturing a transistor according to Embodiment 1.
Figure 2B:
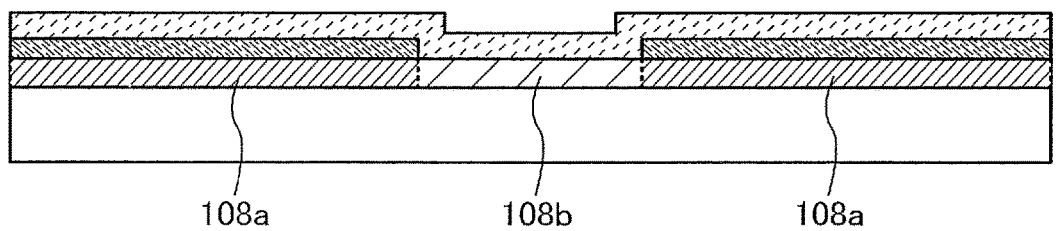

In addition, as the oxidation treatment, heat treatment may be conducted after a layer (a hydrogen adsorption layer) which adsorbs hydrogen included in the oxide semiconductor layer 108 is formed in contact with the oxide semiconductor layer 108. For example, after part of the oxide semiconductor layer 108 is exposed (see FIG. 1C), a hydrogen adsorption layer 115 is formed so as to be in contact with at least the exposed oxide semiconductor layer 108 (see FIG. 2A). After that, heat treatment can be conducted. In this case, hydrogen included in the oxide semiconductor layer 108 which is in contact with the hydrogen adsorption layer 115 is moved to the hydrogen adsorption layer 115 by heat treatment, so that the second region 108b is formed in the oxide semiconductor layer 108 (see FIG. 2B).

The hydrogen adsorption layer 115 may be a film which adsorbs hydrogen included in the oxide semiconductor layer 108 in the oxidation treatment so that the concentration of hydrogen in the oxide semiconductor layer 108 can be effectively reduced. In addition, in the case where the hydrogen barrier layers 113 and the hydrogen adsorption layer 115 are formed in contact with the oxide semiconductor layer 108, a material used for the hydrogen adsorption layer 115 is selected such that more hydrogen is desorbed from a region which is in contact with the hydrogen adsorption layer 115 than from regions which are in contact with the hydrogen barrier layers 113.

The hydrogen adsorption layer 115 can be a single-layer film selected from an amorphous silicon film, a polycrystalline silicon film, and a tungsten oxide film, or a stacked-layer film including two or more layers of them. Alternatively, as the hydrogen adsorption layer 115, a film having a porous structure such as a porous silicon film can be used.

The hydrogen adsorption layer 115 may be removed after the oxidation treatment. Note that in the case where diffusion of hydrogen (reverse diffusion) from the hydrogen adsorption layer 115 to the oxide semiconductor layer 108 does not cause any problems in a later step, the hydrogen adsorption layer 115 may be left. For example, in the case where hydrogen which is taken into the hydrogen adsorption layer 115 from the oxide semiconductor layer 108 is released from the hydrogen adsorption layer 115 to the outside by heat treatment, the hydrogen adsorption layer 115 can be left. In this case, the step for removing the hydrogen adsorption layer 115 can be omitted.

After that, a transistor in which in the oxide semiconductor layer 108, the second region 108b which includes a relatively small amount of hydrogen serves as a channel formation region and the first regions 108a serve as a source region and a drain region can be formed.

Note that in the case where the second region 108b in the oxide semiconductor layer 108 is used as a channel formation region of a transistor, the concentration of hydrogen in the second region 108b in the oxide semiconductor layer 108 is preferably set to greater than or equal to $1\times10^{16}$ atoms/cm$^3$ and less than or equal to $1\times10^{21}$ atoms/cm$^3$ by oxidation treatment.

In such a manner, after the hydrogen barrier layers 113 are selectively formed over the oxide semiconductor layer 108 including hydrogen, a large amount of hydrogen is selectively desorbed from a given region in the oxide semiconductor layer 108 so that regions with different conductivities can be formed in the oxide semiconductor layer 108. In this case, a position where the hydrogen barrier layers 113 are provided is controlled, so that regions with different conductivities can be formed appropriately in the oxide semiconductor layer 108. In addition, after the oxide semiconductor layer 108 which includes hydrogen in advance is formed, hydrogen is desorbed from a given region, so that hydrogen can be included in the oxide semiconductor layer 108 also in a thickness direction of the oxide semiconductor layer 108. In particular, hydrogen is uniformly added into the oxide semiconductor layer 108, so that variations in conductivity between the source region and the drain region which are provided in the oxide semiconductor layer 108 can be reduced.

Note that in this embodiment, a transistor may be a top-gate transistor or a bottom-gate transistor.

In the case of a top-gate transistor, after the step in FIG. 1D, a gate electrode may be formed over the second region 108b in the oxide semiconductor layer 108 with a gate insulating layer interposed therebetween. Moreover, in the case of a bottom-gate transistor, before the step in FIG. 1A, a gate electrode may be formed in advance under the second region 108b in the oxide semiconductor layer 108 with a gate insulating layer interposed therebetween.

Note that this embodiment can be combined with any of the other embodiments as appropriate.

(Embodiment 2)

In this embodiment, an example of a method for manufacturing a bottom-gate transistor which is described in Embodiment 1 is described with reference to drawings.

First, a gate electrode 102 is formed over the substrate 100 and then a gate insulating layer 104 is formed over the gate electrode 102. After that, a source electrode layer 106a and a drain electrode layer 106b are formed over the gate insulating layer 104 (see FIG. 3A).

The substrate 100 may be any substrate as long as it is a substrate having an insulating surface. A glass substrate can be used, for example. Alternatively, as the substrate 100, an insulating substrate which is formed using an insulator such as a ceramic substrate, a quartz substrate, and a sapphire substrate; a semiconductor substrate which is formed using a semiconductor material such as silicon and whose surface is covered with an insulating material; and a conductive substrate which is formed using a conductor such as metal or stainless steel and whose surface is covered with an insulating material can be used. Further, a plastic substrate can also be used as long as it can resist heat treatment in the manufacturing step.

After a conductive layer is formed over the entire surface of the substrate 100, the conductive layer is etched by a photolithography method, so that the gate electrode 102 can be formed. The gate electrode 102 includes an electrode and a wiring which are formed using the conductive layer such as a gate wiring.

It is desirable that the gate electrode 102 be formed using a conductive material such as aluminum (Al), copper (Cu), molybdenum (Mo), tungsten (W), or titanium (Ti). Note that in the case where aluminum is used for the wiring and the electrode, aluminum is preferably used in combination with a conductive material having heat resistance because aluminum has disadvantages such as low heat resistance and a tendency to be corroded when it is used by itself.

As a conductive material having heat resistance, an element selected from titanium (Ti), tantalum (Ta), tungsten (W), molybdenum (Mo), chromium (Cr), neodymium (Nd), and scandium (Sc); an alloy including any of the elements; an alloy including a combination of any of the elements; or a nitride including any of the elements can be used. The wiring and the electrode may be formed by stacking a film formed using such a conductive material having heat resistance and an aluminum film (or a copper film).

Note that the gate electrode 102 can be selectively formed over the substrate 100 by a droplet discharge method, a screen printing method, or the like.

The gate insulating layer 104 can be formed using a silicon oxide film, a silicon oxynitride film, a silicon nitride film, a silicon nitride oxide film, an aluminum oxide film, a tantalum oxide film, or the like. Alternatively, any of these films may be stacked. Any of these films can be formed to a thickness of greater than or equal to 50 nm and less than or equal to 250 nm by a sputtering method or the like. For example, as the gate insulating layer 104, a silicon oxide film can be formed to a thickness of 100 nm by a sputtering method.

After a conductive layer is formed over the gate insulating layer 104, the conductive layer is etched by a photolithography method, so that the source electrode layer 106a and the drain electrode layer 106b can be formed. Here, as an example, a case where the source electrode layer 106a and the drain electrode layer 106b are formed such that parts of the source electrode layer 106a and the drain electrode layer 106b overlap the gate electrode 102 with the gate insulating layer 104 interposed therebetween is described.

The source electrode layer 106a and the drain electrode layer 106b can be formed using a material such as a metal including an element selected from aluminum (Al), copper (Cu), titanium (Ti), tantalum (Ta), tungsten (W), molybdenum (Mo), chromium (Cr), neodymium (Nd), and scandium (Sc); an alloy including any of the elements; or a nitride including any of the elements by a sputtering method, a vacuum evaporation method, or the like.

For example, the source electrode layer 106a and the drain electrode layer 106b can have a single-layer structure including a molybdenum film or a titanium film. Alternatively, the source electrode layer 106a and the drain electrode layer 106b can have a stacked-layer structure including an aluminum film and a titanium film, for example. Further, the source electrode layer 106a and the drain electrode layer 106b may have a three-layer structure in which a titanium film, an aluminum film, and a titanium film are stacked in this order. Furthermore, the source electrode layer 106a and the drain electrode layer 106b may have a three-layer structure in which a molybdenum film, an aluminum film, and a molybdenum film are stacked in this order. In addition, as an aluminum film used for these stacked-layer structures, an aluminum film including neodymium (Al—Nd film) may be used. Moreover, the source electrode layer 106a and the drain electrode layer 106b may have a single-layer structure including an aluminum film containing silicon.

The source electrode layer 106a and the drain electrode layer 106b can also be selectively formed over the substrate 100 by a droplet discharge method, a screen printing method, or the like.

Figure 3A:
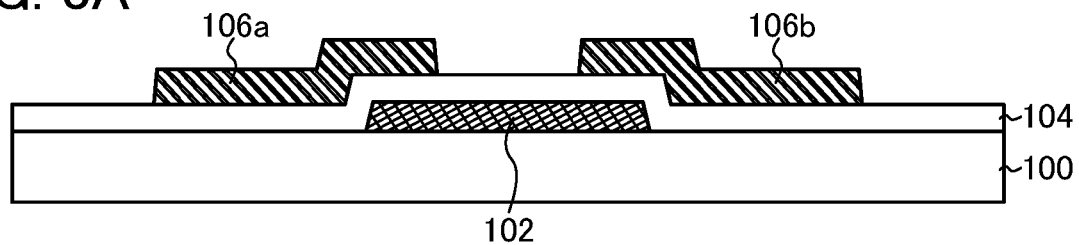
FIGS. 3A to 3E are drawings illustrating an example of a method for manufacturing a transistor according to Embodiment 2.

The source electrode layer 106a formed in FIG. 3A serves as a source of a transistor, and the drain electrode layer 106b formed in FIG. 3A serves as a drain of the transistor. Note that the source electrode layer 106a may serve as a drain and the drain electrode layer 106b may serve as a source depending on a driving method of a transistor.

Figure 3B:
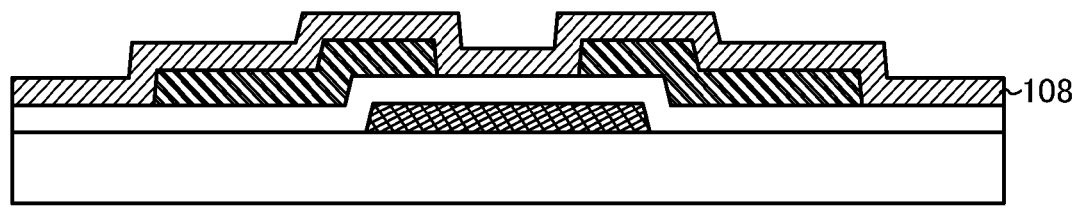

Next, the oxide semiconductor layer 108 is formed so as to cover the gate insulating layer 104, the source electrode layer 106a, and the drain electrode layer 106b (see FIG. 3B).

The oxide semiconductor layer 108 may be formed using a material of which electric resistance is lowered by addition of hydrogen or deuterium. For example, the oxide semiconductor layer 108 may be formed using an In—Ga—Zn—O-based non-single-crystal film or an oxide semiconductor such as zinc oxide (ZnO), indium zinc oxide (IZO), or gallium-doped zinc oxide (GZO). Moreover, hydrogen is introduced into an atmosphere when any of these oxide semiconductors is formed, so that the oxide semiconductor layer 108 including hydrogen can be formed. The oxide semiconductor layer 108 is formed while hydrogen is introduced into a deposition atmosphere, so that hydrogen can be uniformly added into the oxide semiconductor layer 108 even when the oxide semiconductor layer 108 is made thick.

Note that hydrogen may be added to the oxide semiconductor layer 108 by hydrogen plasma treatment, an ion implantation method, or an ion doping method after the oxide semiconductor layer 108 is formed.

Figure 3C:
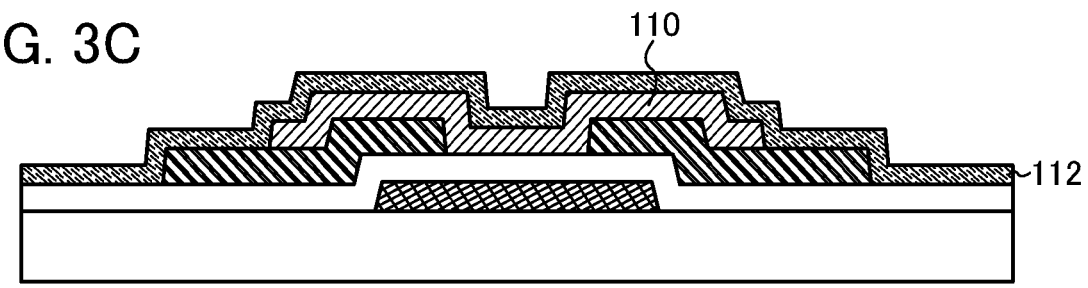

Next, after the oxide semiconductor layer 108 is etched to form an island-shaped oxide semiconductor layer 110, the hydrogen barrier layer 112 is formed over the oxide semiconductor layer 110 (see FIG. 3C).

Note that the hydrogen barrier layer 112 is formed before the oxide semiconductor layer 108 is etched. After that, the oxide semiconductor layer 108 and the hydrogen barrier layer 112 may be etched.

Figure 3D:
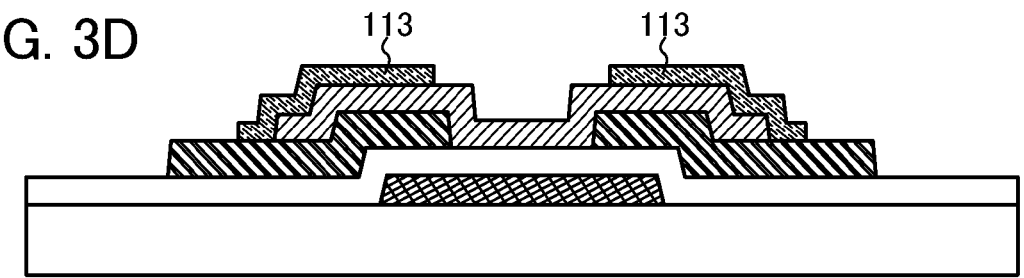

Next, the hydrogen barrier layer 112 is etched so that parts of the hydrogen barrier layer 112 (the hydrogen barrier layers 113) are left and a surface of part of the oxide semiconductor layer 110, which is formed in a region located over the gate electrode 102 and between the source electrode layer 106a and the drain electrode layer 106b, is exposed (see FIG. 3D).

As illustrated in FIG. 3D, the hydrogen barrier layers 113 are left so as to cover end portions of the oxide semiconductor layer 110 so that desorption of hydrogen from the end portions of the oxide semiconductor layer 110 can be reduced in oxidation treatment. Note that in the case where desorption of hydrogen from the end portions of the oxide semiconductor layer 110 does not cause any problems in the oxidation treatment (for example, in the case where the oxide semiconductor layer 110 has a small thickness), a structure in which the hydrogen barrier layers 113 are left over parts of the oxide semiconductor layer 110, which are formed over the source electrode layer 106a and the drain electrode layer 106b may be employed.

In addition, when the hydrogen barrier layer 112 is etched, reduction in thickness of the oxide semiconductor layer 110 is caused in some cases because the exposed surface of the oxide semiconductor layer 110 is also etched at the same time as the hydrogen barrier layer 112 is etched. In this case, in the oxide semiconductor layer 110, the thickness of the exposed region is smaller than the thickness of regions located under the hydrogen barrier layers 113.

Note that the hydrogen barrier layers 113 can also be selectively formed over the substrate 100 by a droplet discharge method, a screen printing method, or the like. In this case, the etching step can be omitted.

Figure 3E:
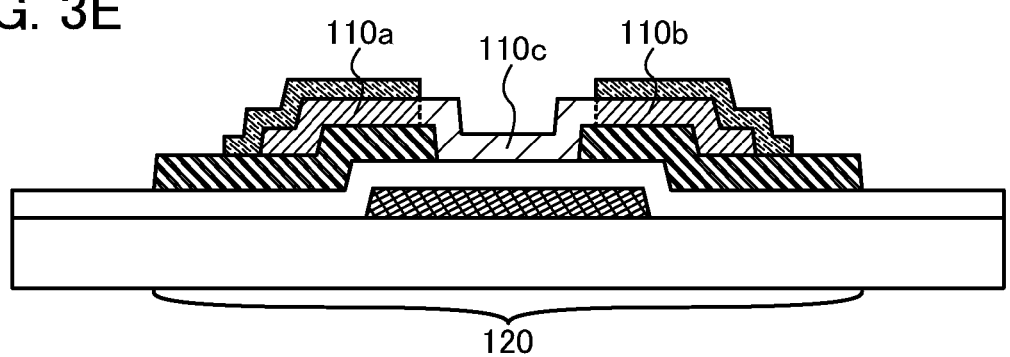

Next, hydrogen is desorbed from the oxide semiconductor layer 110 by conducting oxidation treatment so that in the oxide semiconductor layer 110, a region 110c whose surface is exposed includes less hydrogen than a region 110a and a region 110b which are located under the hydrogen barrier layers 113 (see FIG. 3E). As a result, in the oxide semiconductor layer 110, a channel formation region can be formed in the region located over the gate electrode 102 and between the source electrode layer 106a and the drain electrode layer 106b, and a source region and a drain region can be formed in regions located over the source electrode layer 106a and the drain electrode layer 106b.

The region 110c where the channel formation region is formed includes less hydrogen than the region 110a where the source region is formed and the region 110b where the drain region is formed. In addition, the region 110c has lower conductivity than the region 110a and the region 110b. That is, by conducting the oxidation treatment, a large amount of hydrogen included in the oxide semiconductor layer 110 is selectively desorbed from the portion (the exposed portion) of the oxide semiconductor layer 110 where the hydrogen barrier layers 113 are not formed, so that the channel formation region can be formed.

Note that FIG. 3E illustrates a case where the region 110a and the region 110b which each include a large amount of hydrogen are provided under the hydrogen barrier layers 113 and the region 110c which includes a small amount of hydrogen is provided in the region where the hydrogen barrier layers 113 are not provided for convenience; however, a case where concentration gradients of hydrogen are formed between the region 110a and the region 110c and between the region 110b and the region 110c is also included in this embodiment.

Figure 4A:
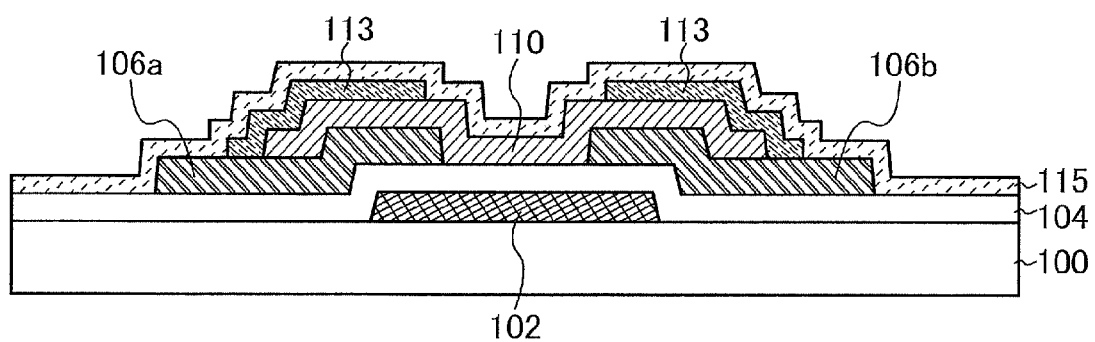
FIGS. 4A and 4B are drawings illustrating an example of a method for manufacturing a transistor according to Embodiment 2.
Figure 4B:
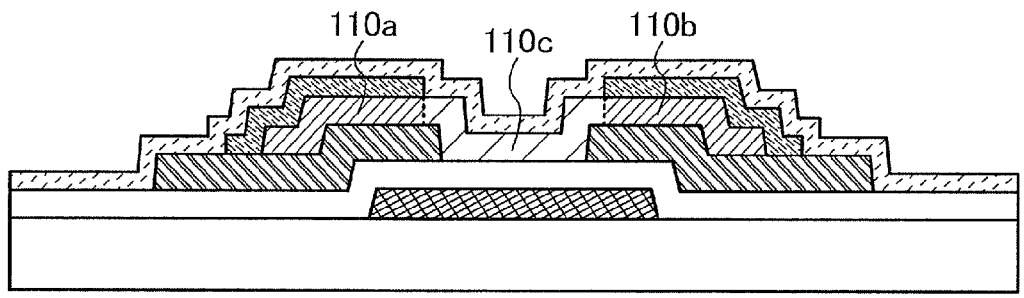

In addition, as the oxidation treatment, a layer (a hydrogen adsorption layer) which adsorbs hydrogen included in the oxide semiconductor layer 110 may be formed in contact with the oxide semiconductor layer 110. For example, after part of the oxide semiconductor layer 110 is exposed (see FIG. 3D), the hydrogen adsorption layer 115 is formed so as to be in contact with at least the exposed oxide semiconductor layer 110 (see FIG. 4A). After that, heat treatment is conducted. Hydrogen included in part of the oxide semiconductor layer 110, which is in contact with the hydrogen adsorption layer 115, is moved to the hydrogen adsorption layer 115 by heat treatment, so that the region 110c where the channel formation region is formed, the region 110a where the source region is formed, and the region 110b where the drain region is formed can be formed (see FIG. 4B).

The hydrogen adsorption layer 115 may be removed after the oxidation treatment. Note that in the case where diffusion (reverse diffusion) of hydrogen from the hydrogen adsorption layer 115 to the oxide semiconductor layer 110 does not cause any problems in a later step, the hydrogen adsorption layer 115 may be left. For example, in the case where hydrogen which is taken into the hydrogen adsorption layer 115 from the oxide semiconductor layer 110 is released from the hydrogen adsorption layer 115 to the outside by heat treatment, the hydrogen adsorption layer 115 can be left. In this case, the step for removing the hydrogen adsorption layer 115 can be omitted.

In such a manner, after the hydrogen barrier layers 113 are selectively formed over the oxide semiconductor layer 110 including hydrogen, a large amount of hydrogen is selectively desorbed from a given region in the oxide semiconductor layer 110, so that regions with different conductivities can be formed in the oxide semiconductor layer 110. In this case, a position where the hydrogen barrier layers 113 are provided is controlled, so that the regions with different conductivities can be formed appropriately in the oxide semiconductor layer 110. In addition, after the oxide semiconductor layer 110 which includes hydrogen in advance is formed, hydrogen is desorbed from a given region, so that hydrogen can be included in the oxide semiconductor layer 110 also in a thickness direction of the oxide semiconductor layer 110. In particular, hydrogen is uniformly added to the oxide semiconductor layer 110 so that variations in conductivity between the source region and the drain region which are provided in the oxide semiconductor layer 110 can be reduced.

Through these steps, a transistor 120 which uses the oxide semiconductor layer as a channel formation region can be formed.

In addition, a protective insulating layer may be formed so as to cover the transistor 120 which includes the oxide semiconductor layer 110, the source electrode layer 106a, the drain electrode layer 106b, and the like. The protective insulating layer may be formed using an insulating layer which includes a small amount of hydrogen. For example, the protective insulating layer may be formed using a single-layer film selected from a silicon oxide film, a silicon nitride film, a silicon oxynitride film, a silicon nitride oxide film, an aluminum oxide film, an aluminum nitride film, an aluminum oxynitride film, and an aluminum nitride oxide film, or a stacked-layer film including two or more layers of them, by a CVD method, a sputtering method, or the like.

After that, various kinds of electrodes and wirings are formed, so that a semiconductor device including the transistor 120 is completed.

Note that FIGS. 3A to 3E illustrate a case where the entire surface of part of the oxide semiconductor layer 110, which is formed in the region located over the gate electrode 102 and between the source electrode layer 106a and the drain electrode layer 106b, is exposed when seen along a cross-sectional direction connecting the source electrode layer 106a and the drain electrode layer 106b (a surface perpendicular to a surface of the substrate 100); however, the present invention is not limited to this.

Figure 5:
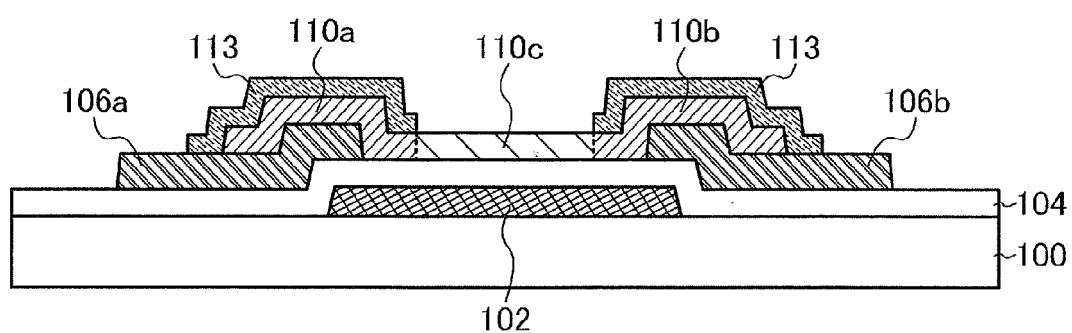
FIG. 5 is a drawing illustrating an example of a method for manufacturing a transistor according to Embodiment 2.

For example, in FIG. 3D, the hydrogen barrier layers 113 may be left over the source electrode layer 106a and the drain electrode layer 106b and the hydrogen barrier layers 113 may be left over parts of the oxide semiconductor layer 110, which are located in regions between the source electrode layer 106a and the drain electrode layer 106b. In this case, in the oxide semiconductor layer 110, the region 110a where the source region is formed and the region 110b where the drain region is formed can also be provided in regions located between the source electrode layer 106a and the drain electrode layer 106b (see FIG. 5). In the case where such a structure is employed, regions which have higher resistance than the source electrode layer 106a and the drain electrode layer 106b and have lower resistance than the region 110c which serves as the channel formation region are provided between the source electrode layer 106a and the channel formation region and between the drain electrode layer 106b and the channel formation region. Thus, the contact resistance can be reduced.

Further, in the structures illustrated in FIGS. 3A to 3E, FIGS. 4A and 4B, and FIG. 5, a material which has hydrogen barrier properties is preferably selected as the material used for the source electrode layer 106a and the drain electrode layer 106b in light of effective suppression of desorption of hydrogen from the region 110a and the region 110b in oxidation treatment.

Furthermore, the hydrogen barrier layers 113 formed using conductors are provided so as to be in contact with the source electrode layer 106a and the drain electrode layer 106b, so that the hydrogen barrier layers 113 can also function as a source electrode layer and a drain electrode layer. In this case, the contact area between the oxide semiconductor layer 110 and the source electrode layer and the contact area between the oxide semiconductor layer 110 and the drain electrode layer increase; thus, the contact resistance between the oxide semiconductor layer 110 and the source electrode layer and the contact resistance between the oxide semiconductor layer 110 and the drain electrode layer can be reduced, which can lead to improvement in element characteristics.

Note that this embodiment can be combined with any of the other embodiments as appropriate.

(Embodiment 3)

In this embodiment, an example of a method for manufacturing a bottom-gate transistor, which is different from the manufacturing method described in Embodiment 2, is described with reference to drawings.

Figure 6A:
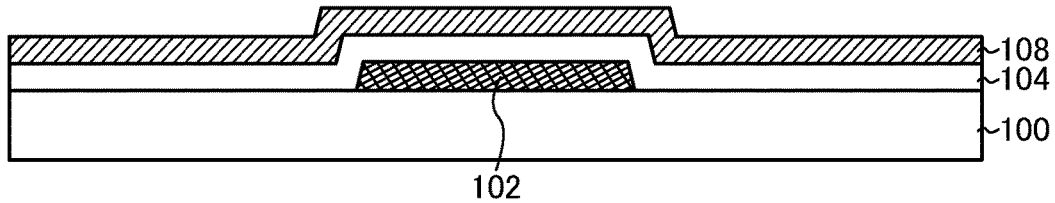
FIGS. 6A to 6E are drawings illustrating an example of a method for manufacturing a transistor according to Embodiment 3.

First, the gate electrode 102 is formed over the substrate 100 and then the gate insulating layer 104 is formed over the gate electrode 102. After that, the oxide semiconductor layer 108 is formed over the gate insulating layer 104 (see FIG. 6A).

Figure 6B:
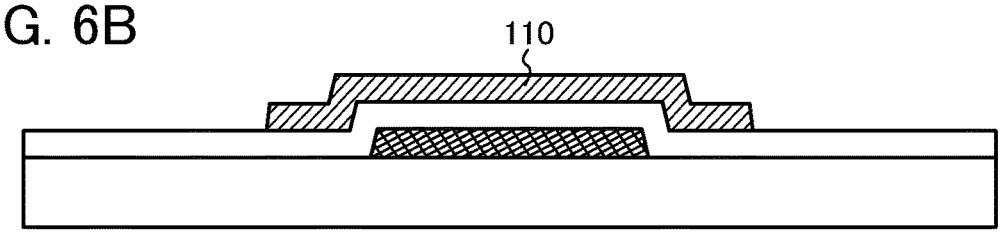
Figure 6C:
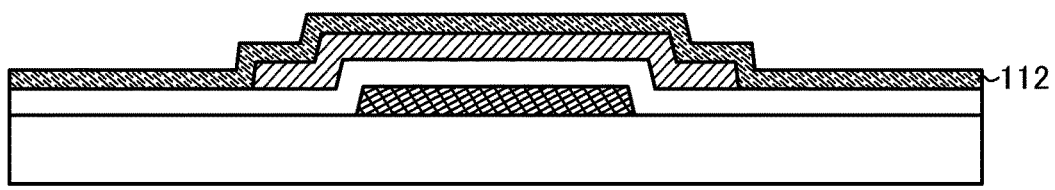

Next, after the oxide semiconductor layer 108 is etched to form the island-shaped oxide semiconductor layer 110 (see FIG. 6B), the hydrogen barrier layer 112 is formed over the oxide semiconductor layer 110 (see FIG. 6C).

Figure 6D:
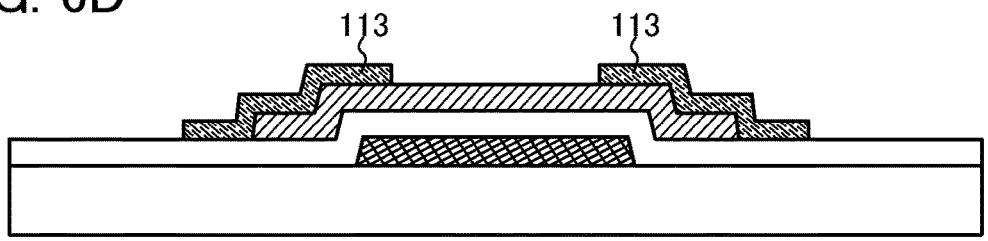

Next, the hydrogen barrier layer 112 is etched so that parts of the hydrogen barrier layer 112 (the hydrogen barrier layers 113) are left and a surface of part of the oxide semiconductor layer 110, which is formed over the gate electrode 102, is exposed (see FIG. 6D).

Figure 6E:
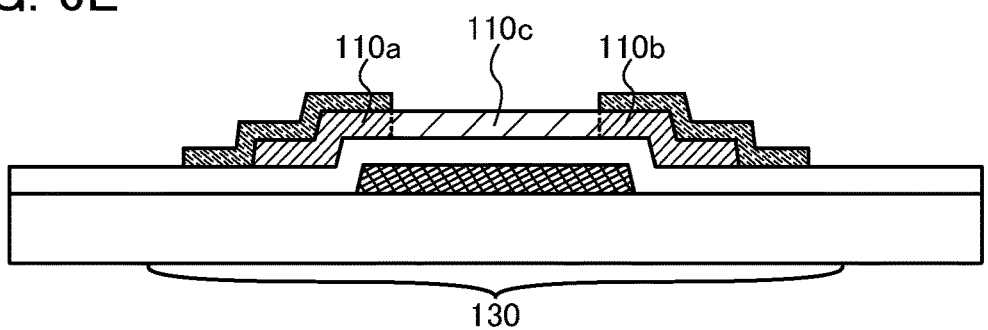

Next, hydrogen is desorbed from the oxide semiconductor layer 110 by conducting oxidation treatment, so that in the oxide semiconductor layer 110, the region 110c whose surface is exposed includes less hydrogen than the region 110a and the region 110b which are located under the hydrogen barrier layers 113 (see FIG. 6E). As a result, in the oxide semiconductor layer 110, the channel formation region can be formed in a region located over the gate electrode 102, and the source region and the drain region can be formed in contact with the channel formation region.

The region 110c where the channel formation region is formed includes less hydrogen than the region 110a where the source region is formed and the region 110b where the drain region is formed. In addition, the region 110c has lower conductivity than the region 110a and the region 110b. That is, by conducting the oxidation treatment, a large amount of hydrogen included in the oxide semiconductor layer 110 is selectively desorbed from the portion (the exposed portion) of the oxide semiconductor layer 110 where the hydrogen barrier layers 113 are not formed, so that the channel formation region is formed.

Note that FIG. 6E illustrates a case where the region 110a and the region 110b which each include a large amount of hydrogen are provided under the hydrogen barrier layers 113 and the region 110c which includes a small amount of hydrogen is provided in the region where the hydrogen barrier layers 113 are not provided for convenience; however, a case where concentration gradients of hydrogen are formed between the region 110a and the region 110c and between the region 110b and the region 110c is also included in this embodiment.

Through these steps, a transistor 130 which uses the oxide semiconductor layer as a channel formation region can be formed.

Note that FIGS. 6A to 6E illustrate a structure in which the source electrode layer 106a and the drain electrode layer 106b are not provided under the oxide semiconductor layer 110 and the oxide semiconductor layer 108 is formed on and in contact with the gate insulating layer 104 as compared with the structure described in Embodiment 2. In the case where the gate insulating layer 104 is formed in contact with the oxide semiconductor layer 110 (for example, in the case where the gate insulating layer 104 and the oxide semiconductor layer 108 are formed continuously), the manufacturing method described in this embodiment may be employed.

In addition, in the case where the resistance of the region 110a and the region 110b is small in the oxide semiconductor layer 108, the region 110a and the region 110b can be used as wirings and electrodes. It is needless to say that a structure in which the source electrode layer and the drain electrode layer are provided over the oxide semiconductor layer 108 with an interlayer insulating layer interposed therebetween can also be employed.

Moreover, in the case where conductive layers are used as the hydrogen barrier layers 113, the hydrogen barrier layers 113 can also function as the source electrode layer and the drain electrode layer.

Note that this embodiment can be combined with any of the other embodiments as appropriate.

(Embodiment 4)

In this embodiment, an example of a method for manufacturing a top-gate transistor which is described in Embodiment 1 is described with reference to drawings.

Figure 7A:
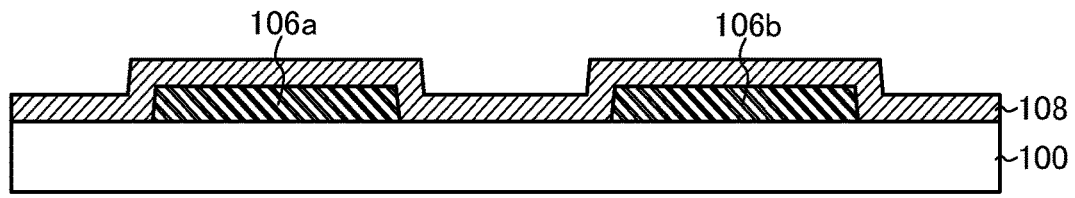
FIGS. 7A to 7E are drawings illustrating an example of a method for manufacturing a transistor according to Embodiment 4.

First, the source electrode layer 106a and the drain electrode layer 106b are formed over the substrate 100 and then the oxide semiconductor layer 108 is formed so as to cover the source electrode layer 106a and the drain electrode layer 106b (see FIG. 7A).

Figure 7B:
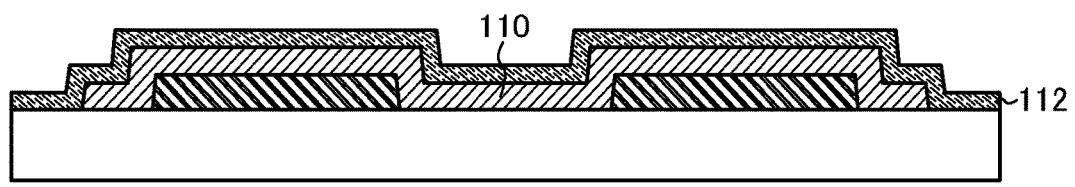

Next, after the oxide semiconductor layer 108 is etched to form the island-shaped oxide semiconductor layer 110, the hydrogen barrier layer 112 is formed over the oxide semiconductor layer 110 (see FIG. 7B).

Figure 7C:
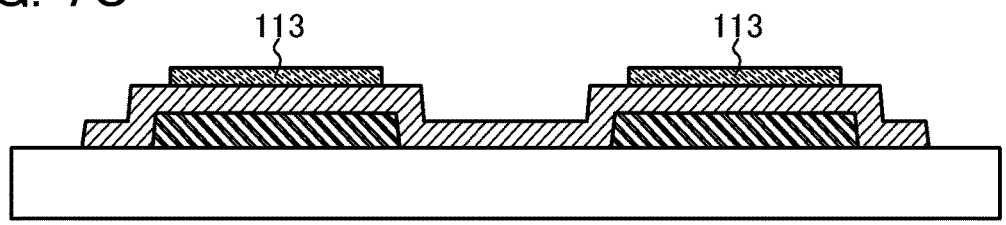

Next, the hydrogen barrier layer 112 is etched so that parts of the hydrogen barrier layer 112 (the hydrogen barrier layers 113) are left and a surface of part of the oxide semiconductor layer 110, which is formed in the region located between the source electrode layer 106a and the drain electrode layer 106b, is exposed (see FIG. 7C).

Figure 7D:
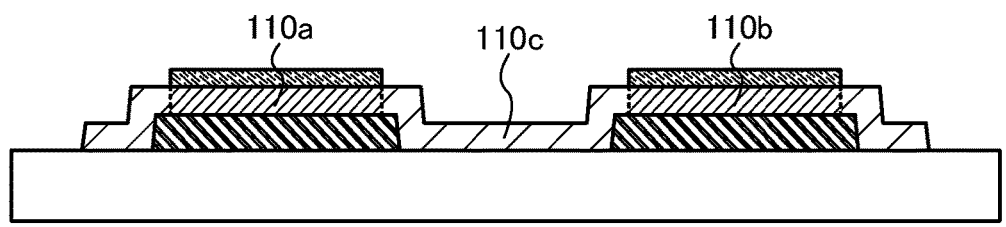

Next, hydrogen is desorbed from the oxide semiconductor layer 110 by conducting oxidation treatment, so that in the oxide semiconductor layer 110, the region 110c whose surface is exposed includes less hydrogen than the region 110a and the region 110b which are located under the hydrogen barrier layers 113 (see FIG. 7D). As a result, in the oxide semiconductor layer 110, the channel formation region can be formed in the region located between the source electrode layer 106a and the drain electrode layer 106b, and a source region and a drain region can be formed in the regions located over the source electrode layer 106a and the drain electrode layer 106b.

The region 110c where the channel formation region is formed includes less hydrogen than the region 110a where the source region is formed and the region 110b where the drain region is formed. In addition, the region 110c has lower conductivity than the region 110a and the region 110b. That is, by conducting the oxidation treatment, a large amount of hydrogen included in the oxide semiconductor layer 110 is selectively desorbed from the portion (the exposed portion) of the oxide semiconductor layer 110 where the hydrogen barrier layers 113 are not formed, so that the channel formation region is formed.

Note that FIG. 7D illustrates a case where the region 110a and the region 110b which each include a large amount of hydrogen are provided under the hydrogen barrier layers 113 and the region 110c which includes a small amount of hydrogen is provided in the region where the hydrogen barrier layers 113 are not provided for convenience; however, a case where concentration gradients of hydrogen are formed between the region 110a and the region 110c and between the region 110b and the region 110c is also included in this embodiment.

Figure 7E:
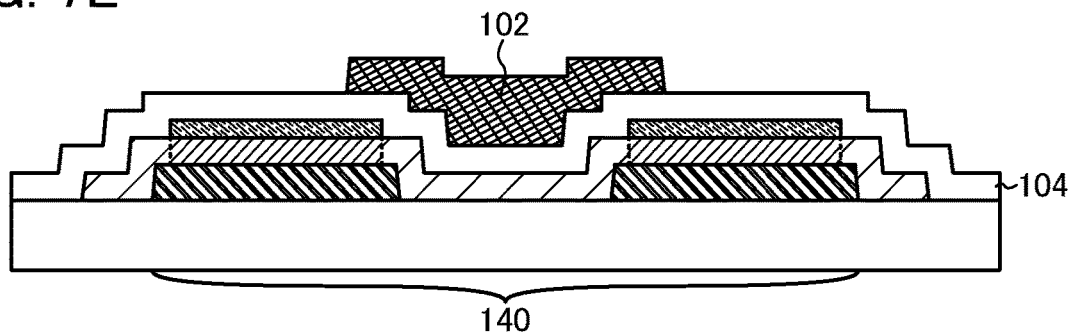

Next, after the gate insulating layer 104 is formed over the oxide semiconductor layer 110 and the hydrogen barrier layers 113, the gate electrode 102 is formed over the gate insulating layer 104 (see FIG. 7E).

Note that the gate electrode 102 is formed so as to overlap at least the region 110c in the oxide semiconductor layer 110. Alternatively, the gate electrode 102 may be formed so as to overlap the region 110a and the region 110b.

In such a manner, after the hydrogen barrier layers 113 are selectively formed over the oxide semiconductor layer 110 including hydrogen, a large amount of hydrogen is selectively desorbed from a given region in the oxide semiconductor layer 110, so that regions with different conductivities can be formed in the oxide semiconductor layer 110. In this case, a position where the hydrogen barrier layers 113 are provided is controlled, so that regions with different conductivities can be formed appropriately in the oxide semiconductor layer 110. In addition, after the oxide semiconductor layer 110 which includes hydrogen in advance is formed, hydrogen is desorbed from a given region, so that hydrogen can be included in the oxide semiconductor layer 110 also in a thickness direction of the oxide semiconductor layer 110. In particular, hydrogen is uniformly added to the oxide semiconductor layer 110, so that variations in conductivity between the source region and the drain region which are provided in the oxide semiconductor layer 110 can be reduced.

Through these steps, a transistor 140 which uses the oxide semiconductor layer as a channel formation region can be formed.

In addition, a protective insulating layer may be formed so as to cover the transistor 140.

After that, various kinds of electrodes and wirings are formed, so that a semiconductor device including the transistor 140 is completed.

Note that FIG. 7C illustrates a case where the entire surface of part of the oxide semiconductor layer 110, which is formed in the region located between the source electrode layer 106a and the drain electrode layer 106b, is exposed when seen along a cross-sectional direction connecting the source electrode layer 106a and the drain electrode layer 106b (a surface perpendicular to the surface of the substrate 100); however, the present invention is not limited to this.

Figure 8A:
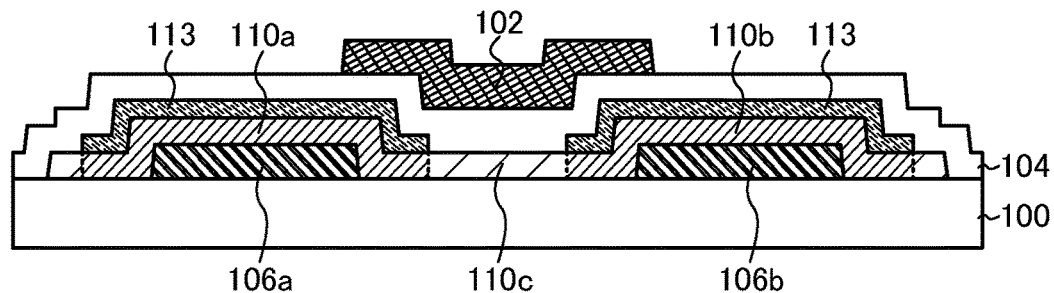
FIGS. 8A to 8C are drawings illustrating an example of a method for manufacturing a transistor according to Embodiment 4.

For example, in FIG. 7C, the hydrogen barrier layers 113 may be left over the source electrode layer 106a and the drain electrode layer 106b and the hydrogen barrier layers 113 may be left over parts of the oxide semiconductor layer 110, which are located in the regions between the source electrode layer 106a and the drain electrode layer 106b. In this case, in the oxide semiconductor layer 110, the region 110a where the source region is formed and the region 110b where the drain region is formed can also be provided in the regions located between the source electrode layer 106a and the drain electrode layer 106b (see FIG. 8A). In the case where such a structure is employed, regions which have low resistance are provided between the source electrode layer 106a and the channel formation region and between the drain electrode layer 106b and the channel formation region. Thus, the contact resistance can be reduced.

Figure 8B:
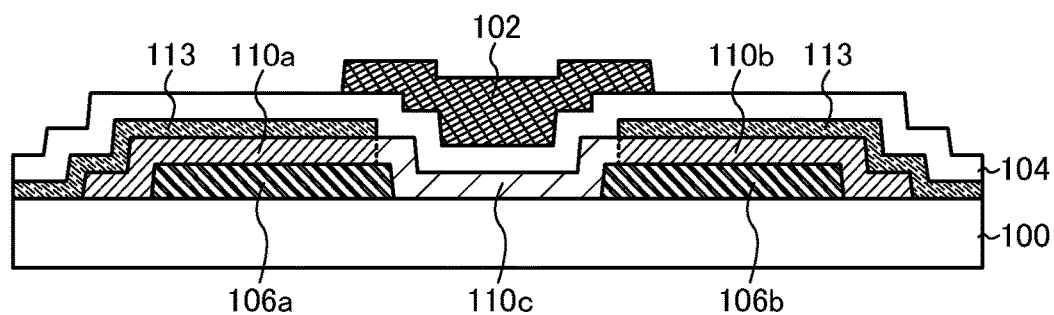

Further, as illustrated in FIG. 8B, the hydrogen barrier layers 113 may be formed so as to cover the end portions of the oxide semiconductor layer 110. By employing such a structure, desorption of hydrogen from the end portions of the oxide semiconductor layer 110 can be suppressed in oxidation treatment.

Figure 8C:
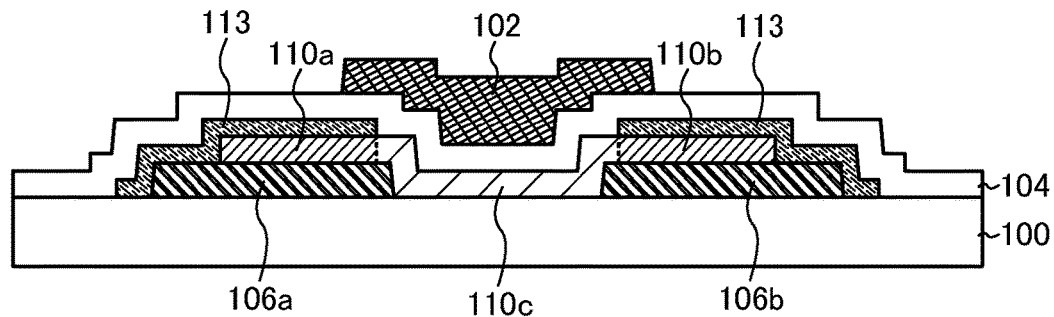

Furthermore, the hydrogen barrier layers 113 formed using conductors are provided so as to be in contact with the source electrode layer 106a and the drain electrode layer 106b (see FIG. 8C), so that the hydrogen barrier layers 113 can also function as a source electrode layer and a drain electrode layer. In this case, the contact area between the oxide semiconductor layer 110 and the source electrode layer and the contact area between the oxide semiconductor layer 110 and the drain electrode layer increase; thus, the contact resistance between the oxide semiconductor layer 110 and the source electrode layer and the contact resistance between the oxide semiconductor layer 110 and the drain electrode layer can be reduced, which can lead to improvement in element characteristics.

In addition, a structure in which hydrogen can be diffused to the substrate 100 side which is in contact with the oxide semiconductor layer 110 may be employed. In this case, the hydrogen adsorption layer which easily diffuses hydrogen from the oxide semiconductor layer 110 may be formed between the substrate 100 and the oxide semiconductor layer 110.

Note that this embodiment can be combined with any of the other embodiments as appropriate.

(Embodiment 5)

In this embodiment, a process for manufacturing a display device, which is an example of applications of a semiconductor device including a transistor, is described with reference to drawings. Note that many parts of the manufacturing process described in this embodiment are the same as those in Embodiment 2. In the following description, details of parts which are common to those in Embodiment 2 are omitted, and different parts are described in detail. Note that in the following description, FIGS. 9A to 9D and FIGS. 10A to 10D are cross-sectional views, and FIG. 11, FIG. 12, FIG. 13, and FIG. 14 are top views.

Figure 11:
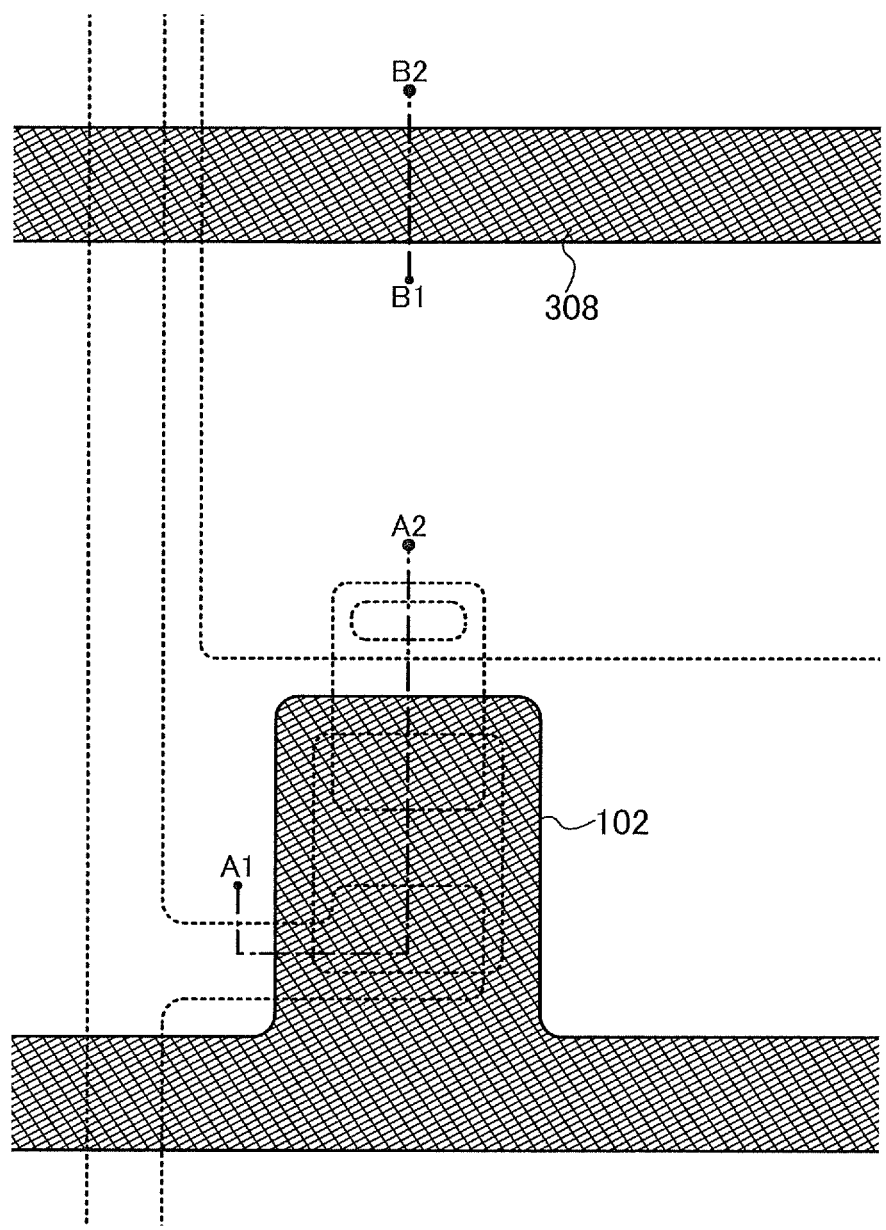
FIG. 11 is a drawing illustrating an example of a method for manufacturing a semiconductor device according to Embodiment 5.

First, wirings and electrodes (a gate wiring including the gate electrode 102, a capacitor wiring 308, and a first terminal 321) are formed over the substrate 100 having an insulating surface (see FIG. 9A and FIG. 11).

The capacitor wiring 308 and the first terminal 321 can be formed using the same material and through the same process as those of the gate electrode 102.

Next, after the gate insulating layer 104 is formed over the gate electrode 102, a conductive layer 106 is formed over the gate insulating layer 104 (see FIG. 9B).

The conductive layer 106 can be formed using a material such as a metal including an element selected from aluminum (Al), copper (Cu), titanium (Ti), tantalum (Ta), tungsten (W), molybdenum (Mo), chromium (Cr), neodymium (Nd), and scandium (Sc); an alloy including any of the elements; or a nitride including any of the elements by a sputtering method, a vacuum evaporation method, or the like.

For example, the conductive layer 106 can have a single-layer structure including a molybdenum film or a titanium film. Alternatively, the conductive layer 106 can have a stacked-layer structure including an aluminum film and a titanium film, for example. Further, the conductive layer 106 may have a three-layer structure in which a titanium film, an aluminum film, and a titanium film are stacked in this order. Furthermore, the conductive layer 106 may have a three-layer structure in which a molybdenum film, an aluminum film, and a molybdenum film are stacked in this order. In addition, as an aluminum film used for these stacked-layer structures, an aluminum film including neodymium (Al—Nd film) may be used. Moreover, the conductive layer 106 may have a single-layer structure including an aluminum film containing silicon.

In FIG. 9B, after the gate insulating layer 104 is formed, a contact hole 313 is formed in the gate insulating layer 104. After that, the conductive layer 106 is formed, so that the first terminal 321 is electrically connected to the conductive layer 106.

Figure 12:
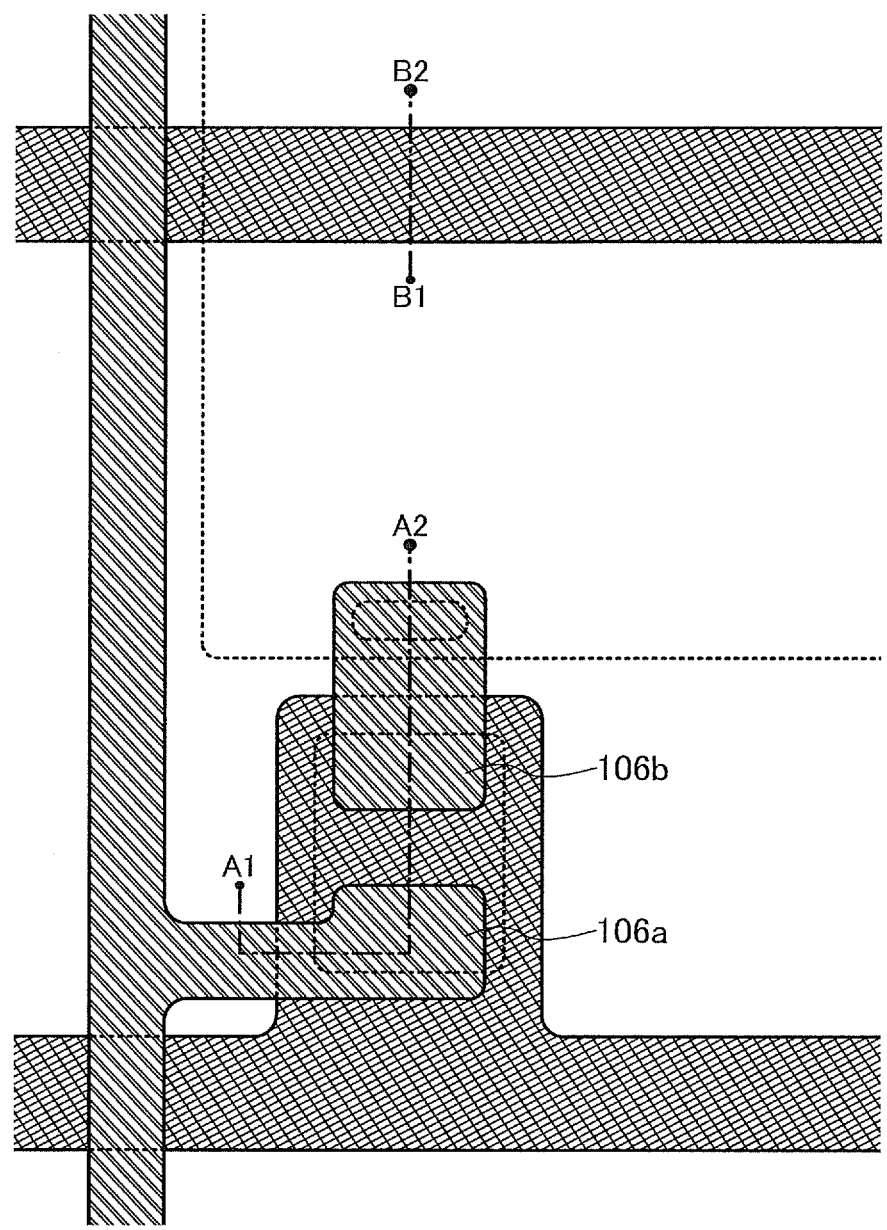
FIG. 12 is a drawing illustrating an example of a method for manufacturing a semiconductor device according to Embodiment 5.

Next, the conductive layer 106 is etched so that the source electrode layer 106a, the drain electrode layer 106b, a connection electrode 320, and a second terminal 322 are formed (see FIG. 9C and FIG. 12).

The second terminal 322 can be electrically connected to a source wiring (a source wiring including the source electrode layer 106a). Moreover, the connection electrode 320 can be directly connected to the first terminal 321 through the contact hole 313 formed in the gate insulating layer 104.

Next, the oxide semiconductor layer 108 is formed so as to cover the gate insulating layer 104, the source electrode layer 106a, the drain electrode layer 106b, the connection electrode 320, and the second terminal 322 (see FIG. 9D).

Next, after the oxide semiconductor layer 108 is etched to form the island-shaped oxide semiconductor layer 110, the hydrogen barrier layer 112 is formed over the oxide semiconductor layer 110 (see FIG. 10A).

Note that the hydrogen barrier layer 112 may be formed before the oxide semiconductor layer 108 is etched. After that, the oxide semiconductor layer 108 and the hydrogen barrier layer 112 may be etched.

Next, the hydrogen barrier layer 112 is etched so that parts of the hydrogen barrier layer 112 (the hydrogen barrier layers 113) are left and a surface of part of the oxide semiconductor layer 110, which is formed in the region located over the gate electrode 102 and between the source electrode layer 106a and the drain electrode layer 106b, is exposed. After that, hydrogen is desorbed from the oxide semiconductor layer 110 by conducting oxidation treatment. As a result, in the oxide semiconductor layer 110, the region 110c where the channel formation region is formed, the region 110a where the source region is formed, and the region 110b where the drain region is formed are formed (see FIG. 10B and FIG. 13).

The region 110c where the channel formation region is formed includes less hydrogen than the region 110a where the source region is formed and the region 110b where the drain region is formed. In addition, the region 110c has lower conductivity than the region 110a and the region 110b. That is, by conducting the oxidation treatment, a large amount of hydrogen included in the oxide semiconductor layer 110 is selectively desorbed from the portion (the exposed portion) of the oxide semiconductor layer 110 where the hydrogen barrier layers 113 are not formed, so that the channel formation region is formed.

Figure 13:
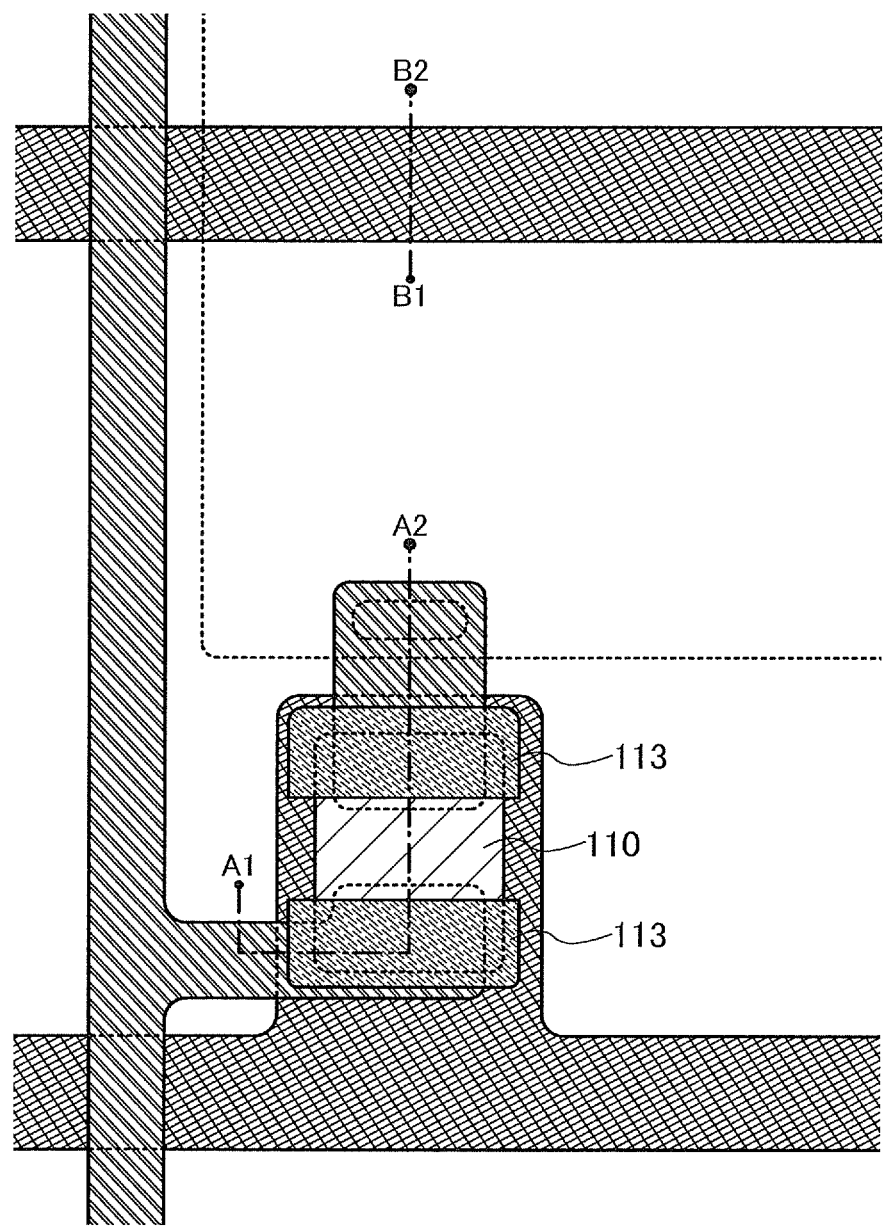
FIG. 13 is a drawing illustrating an example of a method for manufacturing a semiconductor device according to Embodiment 5.

Moreover, as illustrated in FIG. 10B and FIG. 13, the hydrogen barrier layers 113 are left so as to cover the end portions of the oxide semiconductor layer 110, so that desorption of hydrogen from the end portions of the oxide semiconductor layer 110 can be effectively reduced in oxidation treatment.

In addition, when the hydrogen barrier layer 112 is etched, reduction in thickness of the oxide semiconductor layer 110 is caused in some cases because the exposed surface of the oxide semiconductor layer 110 is also etched at the same time as the hydrogen barrier layer 112 is etched. In this case, in the oxide semiconductor layer 110, the thickness of the exposed region is smaller than the thickness of the regions located under the hydrogen barrier layers 113.

Note that the hydrogen barrier layers 113 can also be selectively formed over the substrate 100 by a droplet discharge method, a screen printing method, or the like. In this case, the etching step can be omitted.

Next, heat treatment is preferably conducted at 100° C. to 600° C., typically, 200° C. to 400° C. For example, heat treatment is conducted in a nitrogen atmosphere at 350° C. for one hour. Through the heat treatment, rearrangement at the atomic level occurs in the non-single-crystal film included in the island-shaped oxide semiconductor layer 110. Because strain which inhibits carrier movement is released by the heat treatment, the heat treatment (including optical annealing) is effective. Note that the timing of the heat treatment is not particularly limited as long as it is conducted after the oxide semiconductor layer 108 is formed, and for example, heat treatment may be conducted after a pixel electrode is formed. Moreover, the heat treatment may be combined with heat treatment in oxidation treatment.

In addition, the exposed island-shaped oxide semiconductor layer 110 may be subjected to oxygen radical treatment. By conducting the oxygen radical treatment, the thin film transistor which uses the island-shaped oxide semiconductor layer 110 as a channel formation region can be a normally-off thin film transistor. Moreover, the radical treatment can repair damage due to the etching of the island-shaped oxide semiconductor layer 110. The radical treatment is preferably conducted in an atmosphere of $O_2$ or $N_2O$, and preferably an atmosphere of $N_2$, He, or Ar each including oxygen. The radical treatment may also be conducted in an atmosphere in which $Cl_2$ or $CF_4$ is added to the above atmosphere.

Next, a protective insulating layer 340 is formed so as to cover the obtained transistor, and the protective insulating layer 340 is selectively etched so that a contact hole 325 which reaches the drain electrode layer 106b, a contact hole 326 which reaches the connection electrode 320, and a contact hole 327 which reaches the second terminal 322 are formed (see FIG. 10C).

Figure 14:
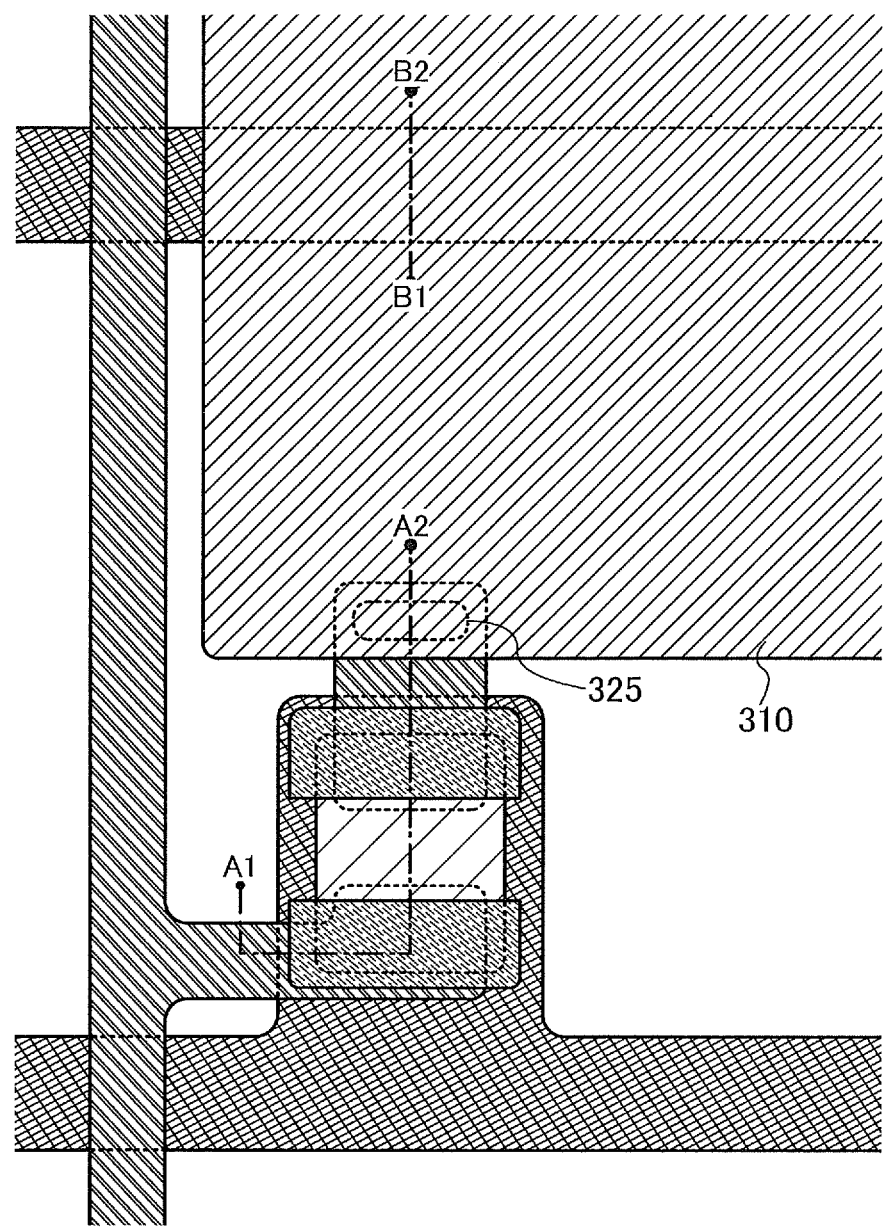
FIG. 14 is a drawing illustrating an example of a method for manufacturing a semiconductor device according to Embodiment 5.

Next, a transparent conductive layer 310 which is electrically connected to the drain electrode layer 106b, a transparent conductive layer 328 which is electrically connected to the connection electrode 320, and a transparent conductive layer 329 which is electrically connected to the second terminal 322 are formed (see FIG. 10D and FIG. 14).

The transparent conductive layer 310 functions as a pixel electrode, the transparent conductive layers 328 and 329 function as electrodes or wirings which are used for connection with an FPC. More specifically, the transparent conductive layer 328 formed over the connection electrode 320 can be used as a terminal electrode for connection, which functions as an input terminal for the gate wiring. The transparent conductive layer 329 formed over the second terminal 322 can be used as a terminal electrode for connection, which functions as an input terminal for the source wiring.

In addition, a storage capacitor can be formed using the capacitor wiring 308, the gate insulating layer 104, the protective insulating layer 340, and the transparent conductive layer 310. In this case, the capacitor wiring 308 and the transparent conductive layer 310 serve as electrodes and the gate insulating layer 104 and the protective insulating layer 340 serve as dielectrics.

The transparent conductive layers 310, 328, and 329 can be formed using indium oxide ($In_2O_3$), an alloy of indium oxide and tin oxide ($In_2O_3$—$SnO_2$, abbreviated as ITO), an alloy of indium oxide and zinc oxide ($In_2O_3$—$ZnO$), or the like by a sputtering method, a vacuum evaporation method, or the like. For example, after the transparent conductive layer is formed, a resist mask is formed over the transparent conductive layer and unnecessary portions are removed by etching, so that the transparent conductive layers 310, 328, and 329 can be formed.

Through these steps, elements such as a bottom-gate n-channel thin film transistor and a storage capacitor can be completed. These elements are arranged in matrix in respective pixels, which can be used as one of substrates for manufacturing an active matrix display device. In this specification, such a substrate is referred to as an active matrix substrate for convenience.

In the case of manufacturing an active matrix liquid crystal display device, an active matrix substrate and a counter substrate provided with a counter electrode may be fixed to each other with a liquid crystal layer interposed therebetween.

Figure 15:
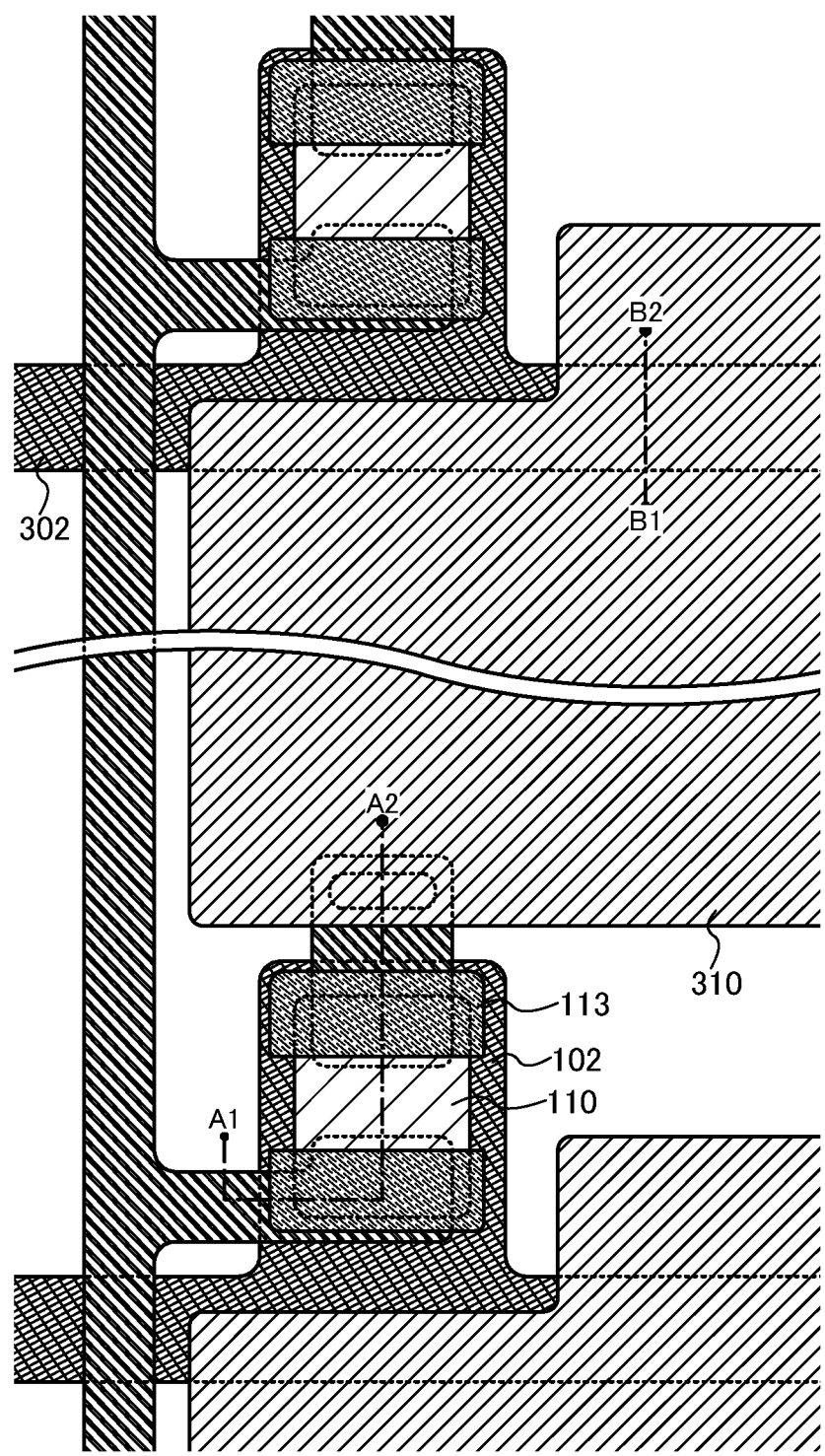
FIG. 15 is a drawing illustrating an example of a method for manufacturing a semiconductor device according to Embodiment 5.

In addition, the structure described in this embodiment is not limited to the pixel structure in FIG. 14. An example of another structure is illustrated in FIG. 15. FIG. 15 illustrates a structure in which the capacitor wiring 308 is not provided, the transparent conductive layer 310 which functions as a pixel electrode and a gate wiring 302 of an adjacent pixel serve as electrodes, and the protective insulating layer 340 and the gate insulating layer 104 serve as dielectrics, so that a storage capacitor is formed.

Note that this embodiment can be combined with any of the other embodiments as appropriate.

(Embodiment 6)

In this embodiment, a case where a thin film transistor is manufactured and used for a pixel portion, and further a semiconductor device having a display function (also referred to as a display device) is manufactured for a driver circuit is described. Furthermore, when a part or the whole of a driver circuit using a thin film transistor is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device also relates to an element substrate, which corresponds to an embodiment before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive layer to be a pixel electrode is formed and before the conductive layer is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

In this embodiment, an example of a liquid crystal display device is described as a semiconductor device including a thin film transistor. First, the appearance and a cross section of a liquid crystal display panel which corresponds to an embodiment of a semiconductor device are described with reference to FIGS. 16A1 and 16A2 and FIG. 16B. FIGS. 16A1 and 16A2 are each a top view of a panel in which thin film transistors 4010 and 4011 each including an oxide semiconductor layer formed over a first substrate 4001 and a liquid crystal element 4013 are sealed between the first substrate 4001 and a second substrate 4006 with a sealant 4005. FIG. 16B is a cross-sectional view taken along the line M-N of FIGS. 16A1 and 16A2.

The sealant 4005 is provided so as to surround a pixel portion 4002 and a scanning line driver circuit 4004 which are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 which is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 16A1 illustrates an example of mounting the signal line driver circuit 4003 by a COG method, and FIG. 16A2 illustrates an example of mounting the signal line driver circuit 4003 by a TAB method.

In addition, the pixel portion 4002 and the scanning line driver circuit 4004, which are provided over the first substrate 4001, each include a plurality of thin film transistors. FIG. 16B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

Structures described in the above embodiments can be applied to the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, which each function as alignment films. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

A columnar spacer denoted by reference numeral 4035 is obtained by selective etching of an insulating layer and is provided in order to control the distance (a cell gap) between the pixel electrode layer 4030 and the counter electrode layer 4031. Note that a spherical spacer may be used. The counter electrode layer 4031 is electrically connected to a common potential line provided over the same substrate as the thin film transistor 4010. With the use of the common connection portion, the counter electrode layer 4031 can be electrically connected to the common potential line through conductive particles provided between the pair of substrates. Note that the conductive particles are included in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent at 5 wt % or more is used for the liquid crystal layer 4008 in order to improve the temperature range. The liquid crystal composition which includes a liquid crystal showing a blue phase and a chiral agent has a short response time of 10 μs to 100 μs, has optical isotropy, which makes the alignment process unneeded, and has a small viewing angle dependence.

Although an example of a transmissive liquid crystal display device is described as a liquid crystal display device in this embodiment, a reflective liquid crystal display device or a semi-transmissive liquid crystal display device can also be employed as a liquid crystal display device.

In the liquid crystal display device described in this embodiment, a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked-layer structure of the polarizing plate and the coloring layer is not limited to that described in this embodiment and may be set as appropriate depending on materials of the polarizing plate and the coloring layer or conditions of manufacturing steps. Furthermore, a light-blocking film which functions as a black matrix may be provided.

In this embodiment, in order to reduce the surface roughness of the thin film transistor and to improve the reliability of the thin film transistor, the thin film transistor is covered with the insulating layers (the insulating layer 4020 and the insulating layer 4021) which function as a protective layer or a planarizing insulating layer. Note that the protective layer is provided to prevent entry of contamination impurities floating in air, such as an organic substance, a metal substance, or moisture, and is preferably a dense film. The protective layer may be formed using a single-layer film selected from a silicon oxide film, a silicon nitride film, a silicon oxynitride film, a silicon nitride oxide film, an aluminum oxide film, an aluminum nitride film, an aluminum oxynitride film, and an aluminum nitride oxide film, or a stacked-layer film including two or more layers of them, by a sputtering method. Although an example in which the protective layer is formed by a sputtering method is described in this embodiment, the present invention is not limited to this method and a variety of methods may be employed.

In this embodiment, the insulating layer 4020 having a stacked-layer structure is formed as the protective layer. As a first layer of the insulating layer 4020, a silicon oxide film is formed by a sputtering method. The use of the silicon oxide film as the protective layer has an effect of preventing a hillock of an aluminum film used for the source electrode layer and the drain electrode layer.

As a second layer of the insulating layer 4020, an insulating layer is formed. In this embodiment, as the second layer of the insulating layer 4020, a silicon nitride film is formed by a sputtering method. The use of the silicon nitride film as the protective layer can suppress entrance of mobile ions such as sodium ions into a semiconductor region, thereby suppressing variations in electrical characteristics of the TFT.

After the protective layer is formed, the semiconductor layer may be subjected to annealing (300° C. to 400° C.).

The insulating layer 4021 is formed as the planarizing insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed using these materials.

Note that a siloxane-based resin is a resin formed using a siloxane material as a starting material and having a Si—O—Si bond. A siloxane-based resin may include, as a substituent, an organic group (for example, an alkyl group or an aryl group) or a fluoro group. The organic group may include a fluoro group.

There is no particular limitation on the method for forming the insulating layer 4021, and the insulating layer 4021 can be formed, depending on the material, by a sputtering method, an SOG method, a spin coating method, a dipping method, a spray coating method, a droplet discharge method (for example, an inkjet method, screen printing, offset printing, or the like), a doctor knife, a roll coater, a curtain coater, a knife coater, or the like. In the case where the insulating layer 4021 is formed using a material solution, annealing (300° C. to 400° C.) of the semiconductor layer may be conducted at the same time as a baking step. The baking step of the insulating layer 4021 also serves as the annealing step of the semiconductor layer, whereby a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

A conductive composition including a conductive high molecule (also referred to as a conductive polymer) can be used for the pixel electrode layer 4030 and the counter electrode layer 4031. The pixel electrode formed using the conductive composition preferably has a light transmittance of 70% or more at a wavelength of 550 nm. Furthermore, the resistivity of the conductive high molecule included in the conductive composition is preferably 0.1 Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, a copolymer of two or more kinds of them, and the like.

In addition, a variety of signals and potentials are supplied to the signal line driver circuit 4003 that is formed separately, and the scanning line driver circuit 4004 or the pixel portion 4002 from an FPC 4018.

In this embodiment, a connection terminal electrode 4015 is formed from the same conductive layer as the pixel electrode layer 4030 included in the liquid crystal element 4013, and a terminal electrode 4016 is formed from the same conductive layer as a source electrode layer and a drain electrode layer of the thin film transistors 4010 and 4011.

The connection terminal electrode 4015 is electrically connected to a terminal included in the FPC 4018 through an anisotropic conductive layer 4019.

Note that FIGS. 16A1 and 16A2 and FIG. 16B illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 17:
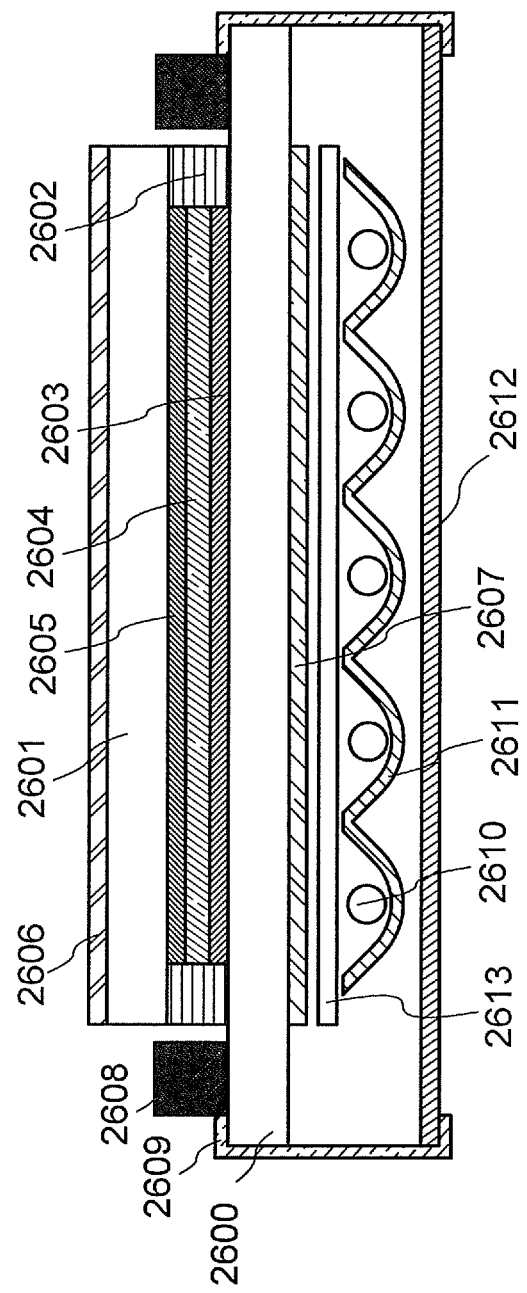
FIG. 17 is a drawing illustrating an example of a semiconductor device according to Embodiment 6.

FIG. 17 illustrates an example of a structure in which a liquid crystal display module which corresponds to an embodiment of a semiconductor device is formed using a TFT substrate 2600.

FIG. 17 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit substrate 2612 is connected to a wiring circuit portion 2608 of the TFT substrate 2600 through a flexible wiring substrate 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through these steps, a highly reliable liquid crystal display device can be manufactured as a semiconductor device.

The structure described in this embodiment can be combined with the structure described in any of the other embodiments as appropriate.

(Embodiment 7)

In this embodiment, electronic paper is described as an example of semiconductor devices including transistors.

Figure 18:
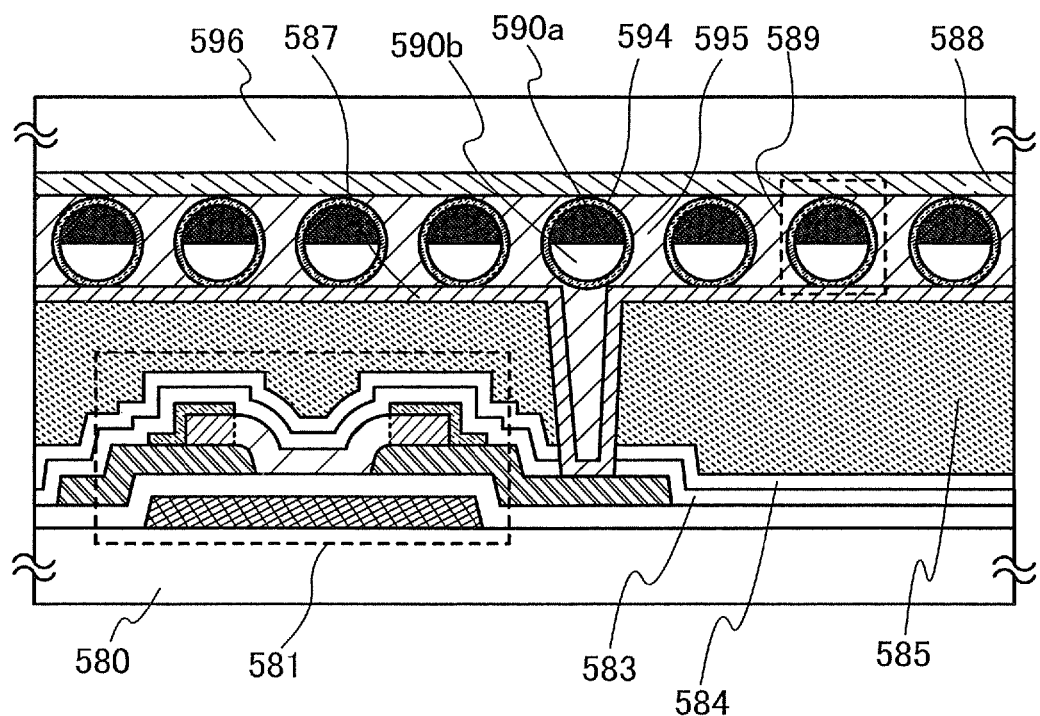
FIG. 18 is a drawing illustrating an example of a semiconductor device according to Embodiment 7.

FIG. 18 illustrates active matrix electronic paper as an example of semiconductor devices. A thin film transistor 581 used for a semiconductor device can be formed in a manner similar to those of the thin film transistors described in Embodiments 1 to 5.

The electronic paper in FIG. 18 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 provided over a substrate 580 is a thin film transistor with a bottom gate structure, and a source electrode layer or a drain electrode layer thereof is electrically connected to a first electrode layer 587 through contact holes formed in insulating layers 583, 584, and 585. Between the first electrode layer 587 and a second electrode layer 588, spherical particles 589 each having a black region 590a, a white region 590b, and a cavity 594 around the regions which is filled with liquid are provided. A space around the spherical particles 589 is provided with a filler 595 such as a resin (see FIG. 18). In FIG. 18, the first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion described in the above embodiment, the second electrode layer 588 provided on a substrate 596 can be electrically connected to the common potential line through conductive particles provided between a pair of substrates.

Instead of the twisting ball, an electrophoretic element can also be used. In this case, a microcapsule having a diameter of about 10 μm to 200 μm in which transparent liquid, positively-charged white microparticles, and negatively-charged black microparticles are encapsulated is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be simply referred to as a display device or a semiconductor device provided with a display device) is distanced from an electric wave source.

Through these steps, highly reliable electronic paper can be manufactured as a semiconductor device.

The structure described in this embodiment can be combined with the structure described in any of the other embodiments as appropriate.

(Embodiment 8)

In this embodiment, a light-emitting display device is described as an example of semiconductor devices including transistors. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. Then, the carriers (electrons and holes) recombine, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is sandwiched between dielectric layers, which are further sandwiched between electrodes, and its light emission mechanism is localized type light emission which utilizes inner-shell electron transition of metal ions. Note that description is made here using an organic EL element as a light-emitting element.

Figure 19:
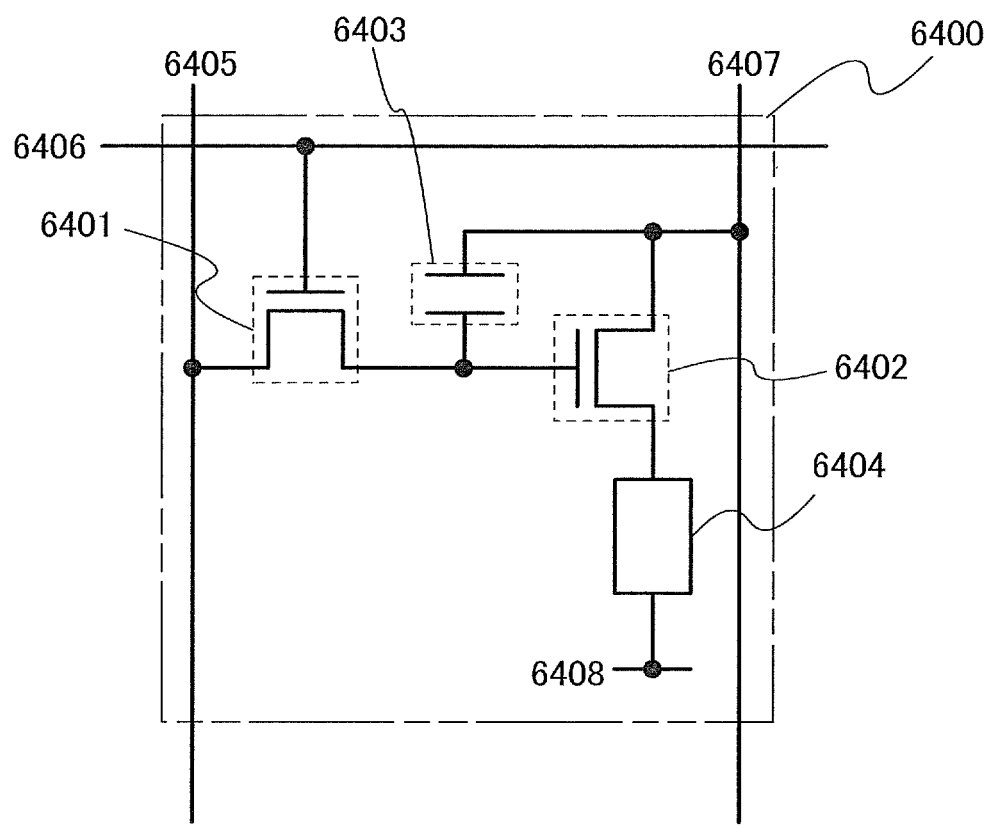
FIG. 19 is a drawing illustrating an example of an equivalent circuit of a pixel in a semiconductor device according to Embodiment 8.

FIG. 19 illustrates an example of a pixel structure which can be driven by a digital time grayscale method as an example of semiconductor devices.

The structure and operation of a pixel which can be driven by a digital time grayscale method are described. In this example, one pixel includes two n-channel transistors each of which includes an oxide semiconductor layer (for example, an In—Ga—Zn—O-based non-single-crystal film) as a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408.

Note that the second electrode (common electrode 6408) of the light-emitting element 6404 is set to a low power supply potential. The low power supply potential is lower than a high power supply potential which is supplied to the power supply line 6407. For example, GND or 0 V may be set as the low power supply potential. A potential difference between the high power supply potential and the low power supply potential is applied to the light-emitting element 6404 so that a current flows through the light-emitting element 6404, whereby the light-emitting element 6404 emits light. Thus, each potential is set so that the potential difference between the high power supply potential and the low power supply potential is greater than or equal to a forward threshold voltage.

When the gate capacitance of the driving transistor 6402 is used as a substitute for the capacitor 6403, the capacitor 6403 can be omitted. The gate capacitance of the driving transistor 6402 may be formed between a channel formation region and a gate electrode.

Here, in the case of using a voltage-input voltage driving method, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage greater than or equal to (power supply line voltage+$V_{th}$ of the driving transistor 6402) is applied to the signal line 6405.

In the case of using an analog grayscale method instead of the digital time grayscale method, the same pixel structure as that in FIG. 19 can be employed by inputting signals in a different way.

In the case of using the analog grayscale method, a voltage greater than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to enable the driving transistor 6402 to operate in a saturation region, a current can be supplied to the light-emitting element 6404. In order that the driving transistor 6402 can operate in the saturation region, the potential of the power supply line 6407 is higher than a gate potential of the driving transistor 6402. Because the video signal is an analog signal, a current in accordance with the video signal flows in the light-emitting element 6404, and the analog grayscale method can be performed.

Note that the pixel structure is not limited to that illustrated in FIG. 19. For example, the pixel illustrated in FIG. 19 can further include a switch, a resistor, a capacitor, a transistor, a logic circuit, or the like.

Next, structures of the light-emitting element are described with reference to FIGS. 20A to 20C. Here, a cross-sectional structure of a pixel is described by taking an n-channel driving TFT as an example. Driving TFTs 7001, 7011, and 7021 used for semiconductor devices illustrated in FIGS. 20A to 20C can be manufactured in a manner similar to those of the thin film transistors described in the above embodiments.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate, a bottom emission structure in which light is extracted through the surface on the substrate side, or a dual emission structure in which light is extracted through the surface opposite to the substrate and the surface on the substrate side. The pixel structure can be applied to a light-emitting element having any of these emission structures.

A light-emitting element having a top emission structure is described with reference to FIG. 20A.

Figure 20A:
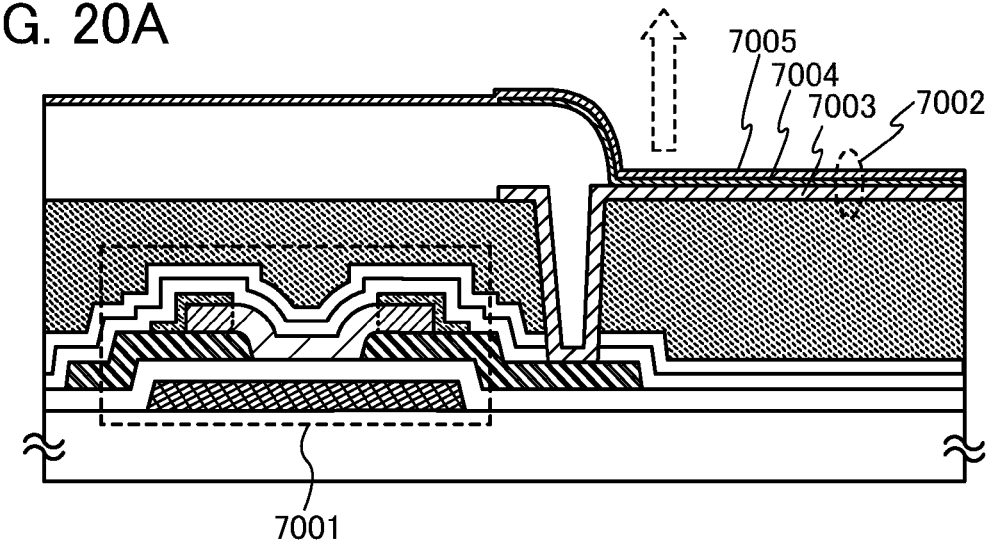
FIGS. 20A to 20C are drawings illustrating examples of a semiconductor device according to Embodiment 8.

FIG. 20A is a cross-sectional view of a pixel in the case where the driving TFT 7001 is an n-channel TFT and light is emitted from a light-emitting element 7002 to an anode 7005 side. In FIG. 20A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed as a single layer or a plurality of layers stacked. When the light-emitting layer 7004 is formed as a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that not all of these layers need to be provided. The anode 7005 may be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 20A, light is emitted from the light-emitting element 7002 to the anode 7005 side as indicated by an arrow.

Next, a light-emitting element having a bottom emission structure is described with reference to FIG. 20B. FIG. 20B is a cross-sectional view of a pixel in the case where the driving TFT 7011 is an n-channel TFT and light is emitted from a light-emitting element 7012 to a cathode 7013 side. In FIG. 20B, the cathode 7013 of the light-emitting element 7012 is formed over a light-transmitting conductive layer 7017 which is electrically connected to the driving TFT 7011, and a light-emitting layer 7014 and an anode 7015 are stacked in this order over the cathode 7013. Note that a light-blocking layer 7016 for reflecting or blocking light may be formed to cover the anode 7015 when the anode 7015 has a light-transmitting property. For the cathode 7013, various materials can be used, as in the case of FIG. 20A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 20A, the light-emitting layer 7014 may be formed using either a single layer or a plurality of layers stacked. The anode 7015 is not required to transmit light, but can be formed using a light-transmitting conductive material as in the case of FIG. 20A. As the light-blocking layer 7016, a metal or the like which reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 20B, light is emitted from the light-emitting element 7012 to the cathode 7013 side as indicated by an arrow.

Next, a light-emitting element having a dual emission structure is described with reference to FIG. 20C. In FIG. 20C, a cathode 7023 of a light-emitting element 7022 is formed over a light-transmitting conductive layer 7027 which is electrically connected to the driving TFT 7021, and a light-emitting layer 7024 and an anode 7025 are stacked in this order over the cathode 7023. As in the case of FIG. 20A, the cathode 7023 can be formed using a variety of conductive materials as long as they have a low work function. Note that the cathode 7023 is formed to have a thickness that can transmit light. For example, a 20-nm-thick Al film can be used as the cathode 7023. As in the case of FIG. 20A, the light-emitting layer 7024 may be formed using either a single layer or a plurality of layers stacked. The anode 7025 can be formed using a light-transmitting conductive material as in the case of FIG. 20A.

The light-emitting element 7022 corresponds to a region where the cathode 7023, the light-emitting layer 7024, and the anode 7025 overlap with one another. In the case of the pixel illustrated in FIG. 20C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 20B:
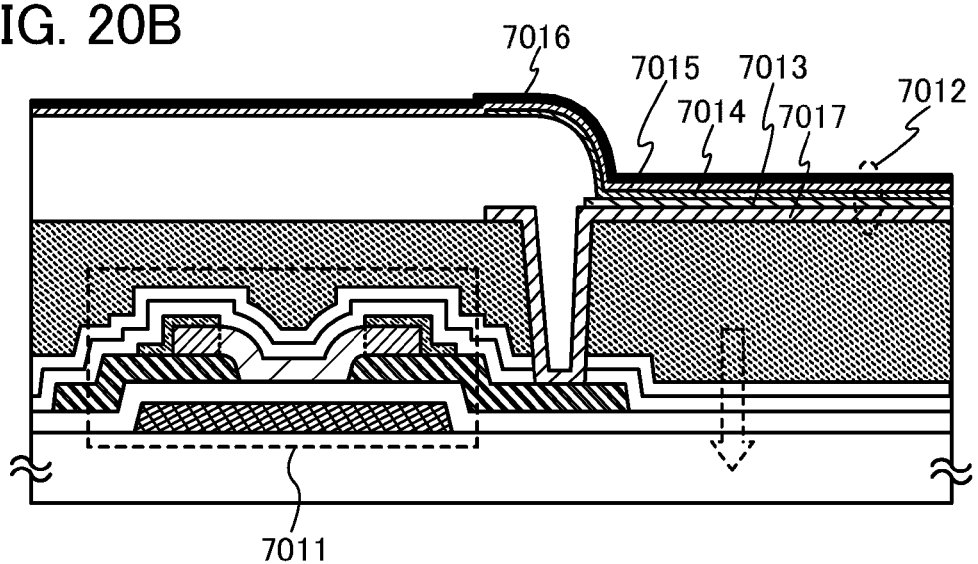
Figure 20C:
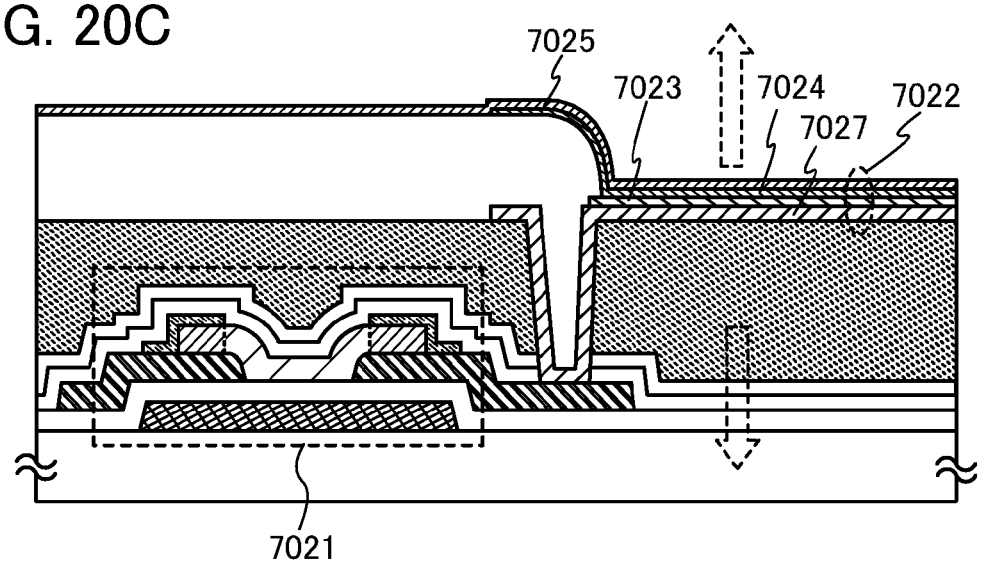

Note that the structure of the semiconductor device described in this embodiment is not limited to those illustrated in FIGS. 20A to 20C and can be modified in various ways.

Figure 21A:
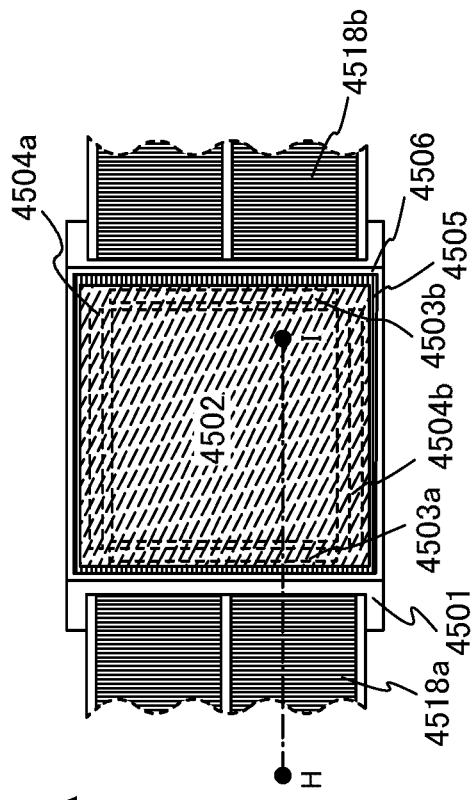
FIGS. 21A and 21B are drawings illustrating an example of a semiconductor device according to Embodiment 8.
Figure 21B:
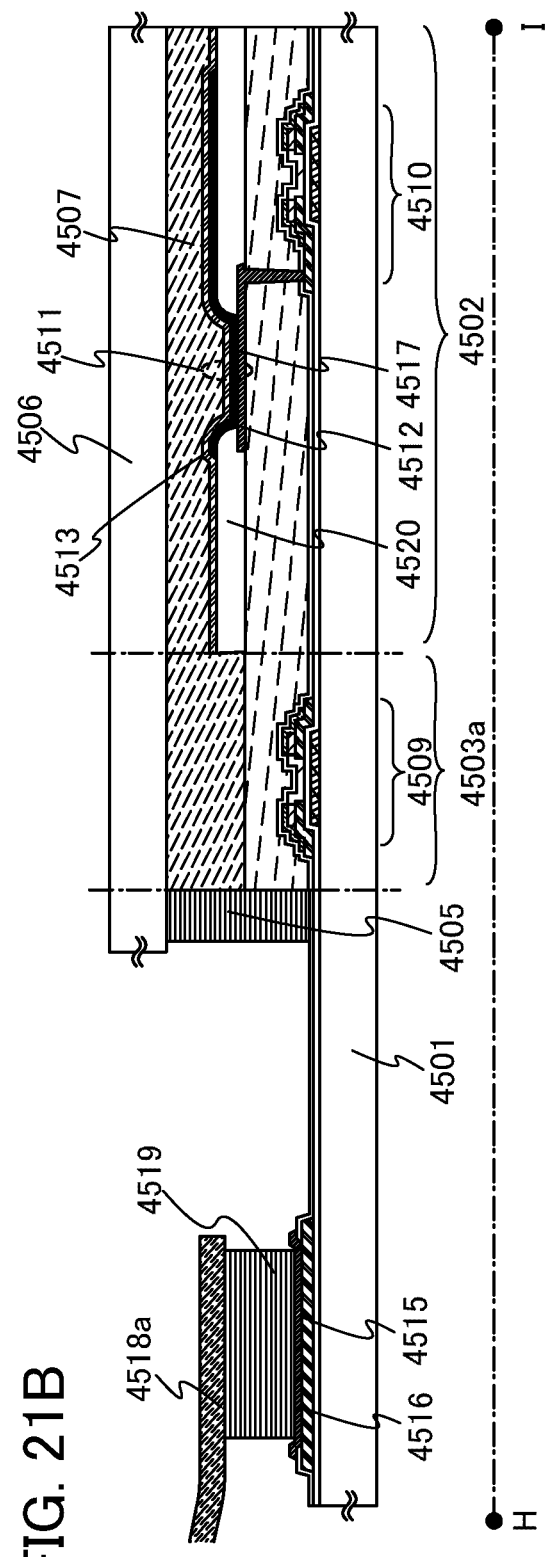

Next, the appearance and a cross section of a light-emitting display panel (also referred to as a light-emitting panel), which is an embodiment of the semiconductor device, is described with reference to FIGS. 21A and 21B. FIG. 21A is a top view of a panel in which thin film transistors 4509 and 4510 and a light-emitting element 4511 are sealed between a first substrate 4501 and a second substrate 4506 with a sealant 4505. FIG. 21B is a cross-sectional view taken along the line H-I of FIG. 21A.

The sealant 4505 is provided so as to surround a pixel portion 4502, signal line driver circuits 4503*a* and 4503*b*, and scanning line driver circuits 4504*a* and 4504*b*, which are provided over the first substrate 4501. In addition, the second substrate 4506 is provided over the pixel portion 4502, the signal line driver circuits 4503*a* and 4503*b*, and the scanning line driver circuits 4504*a* and 4504*b*. Accordingly, the pixel portion 4502, the signal line driver circuits 4503*a* and 4503*b*, and the scanning line driver circuits 4504*a* and 4504*b* are sealed together with a filler 4507, by the first substrate 4501, the sealant 4505, and the second substrate 4506. Thus, it is preferable that the pixel portion 4502, the signal line driver circuits 4503*a* and 4503*b*, and the scanning line driver circuits 4504*a* and 4504*b* be packaged (sealed) with a protective film (such as an attachment film or an ultraviolet curable resin film) or a cover material with high air-tightness and little degasification so that the display device is not exposed to the outside air.

The pixel portion 4502, the signal line driver circuits 4503*a* and 4503*b*, and the scanning line driver circuits 4504*a* and 4504*b*, which are formed over the first substrate 4501, each include a plurality of thin film transistors, and a thin film transistor 4510 included in the pixel portion 4502 and a thin film transistor 4509 included in the signal line driver circuit 4503*a* are illustrated as an example in FIG. 21B.

The thin film transistors 4509 and 4510 can employ the structures described in the above embodiments. In this embodiment, the thin film transistors 4509 and 4510 are n-channel thin film transistors.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is not limited to the stacked-layer structure described in this embodiment, which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is formed using an organic resin film, an inorganic insulating layer, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition wall 4520 in order to prevent oxygen, hydrogen, moisture, carbon dioxide, or the like from entering the light-emitting element 4511. As the protective layer, a silicon nitride film, a silicon nitride oxide film, a DLC film, or the like can be formed.

A variety of signals and potentials are supplied to the signal line driver circuits 4503*a* and 4503*b*, the scanning line driver circuits 4504*a* and 4504*b*, or the pixel portion 4502 from FPCs 4518*a* and 4518*b*.

In this embodiment, a connection terminal electrode 4515 is formed from the same conductive layer as the first electrode layer 4517 included in the light-emitting element 4511, and a terminal electrode 4516 is formed from the same conductive layer as the source electrode layer and the drain electrode layer included in the thin film transistors 4509 and 4510.

The connection terminal electrode 4515 is electrically connected to a terminal included in the FPC 4518*a* through an anisotropic conductive layer 4519.

The second substrate located in the direction in which light is extracted from the light-emitting element 4511 needs to have a light-transmitting property. In this case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scanning line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 21A and 21B.

Through these steps, a highly reliable light-emitting display device (display panel) can be manufactured as a semiconductor device.

The structure described in this embodiment can be combined with the structure described in any of the other embodiments as appropriate.

(Embodiment 9)

The semiconductor devices each including a transistor, which are described in the above embodiments, can be applied to electronic paper. Electronic paper can be used for electronic devices of a variety of fields as long as they can display data. For example, electronic paper can be applied to an electronic book (e-book reader), a poster, an advertisement in a vehicle such as a train, or displays of various cards such as a credit card. Examples of the electronic devices are illustrated in FIGS. 22A and 22B and FIG. 23.

Figure 22A:
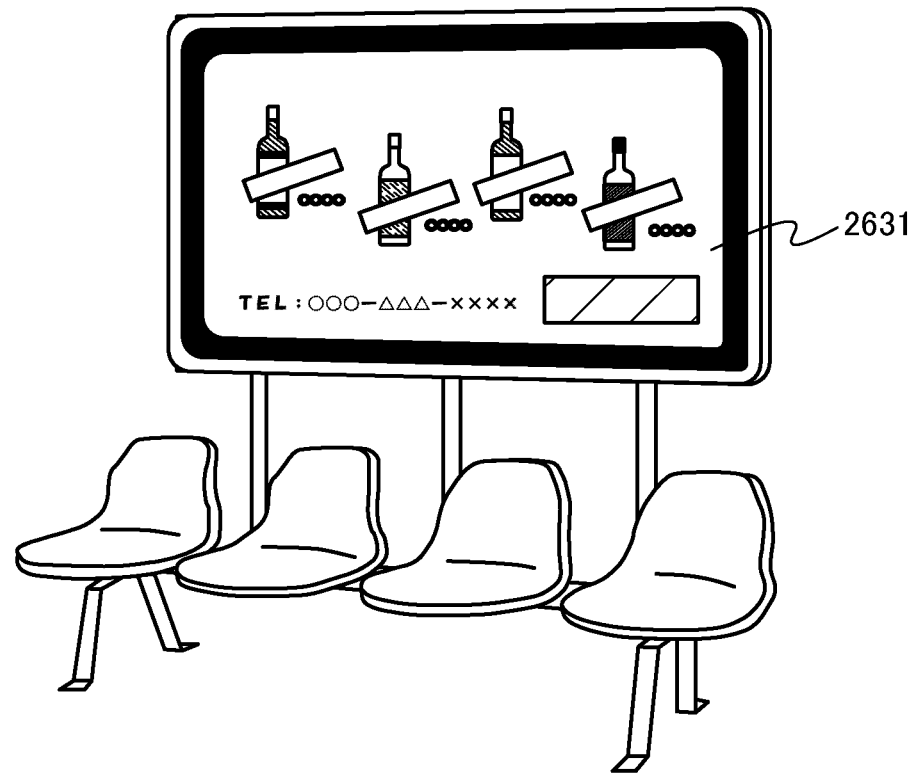
FIGS. 22A and 22B are drawings illustrating examples of applications of electronic paper.

FIG. 22A illustrates a poster 2631 formed using electronic paper. In the case where an advertising medium is printed paper, the advertisement is replaced by hands; however, by using electronic paper, the advertising display can be changed in a short time. Furthermore, stable images can be obtained without display defects. Note that the poster may have a configuration capable of wirelessly transmitting and receiving data.

Figure 22B:
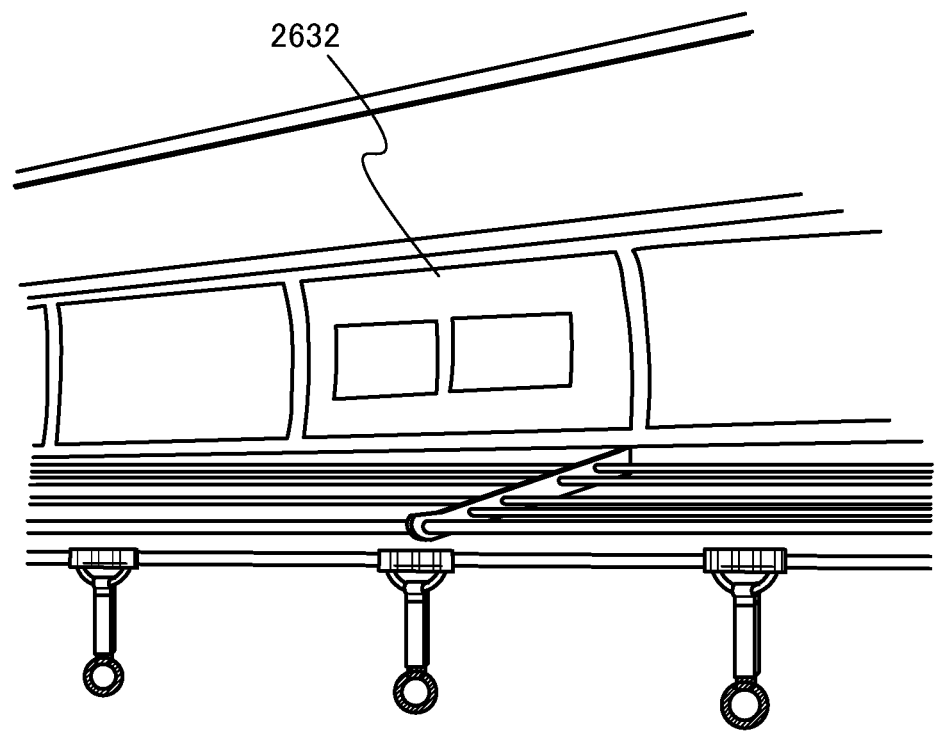

FIG. 22B illustrates an advertisement 2632 in a vehicle such as a train. In the case where an advertising medium is printed paper, the advertisement is replaced by hands; however, by using electronic paper, the advertising display can be changed in a short time with less manpower. Furthermore, stable images can be obtained without display defects. Note that the advertisement 2632 in a vehicle may have a configuration capable of wirelessly transmitting and receiving data.

Figure 23:
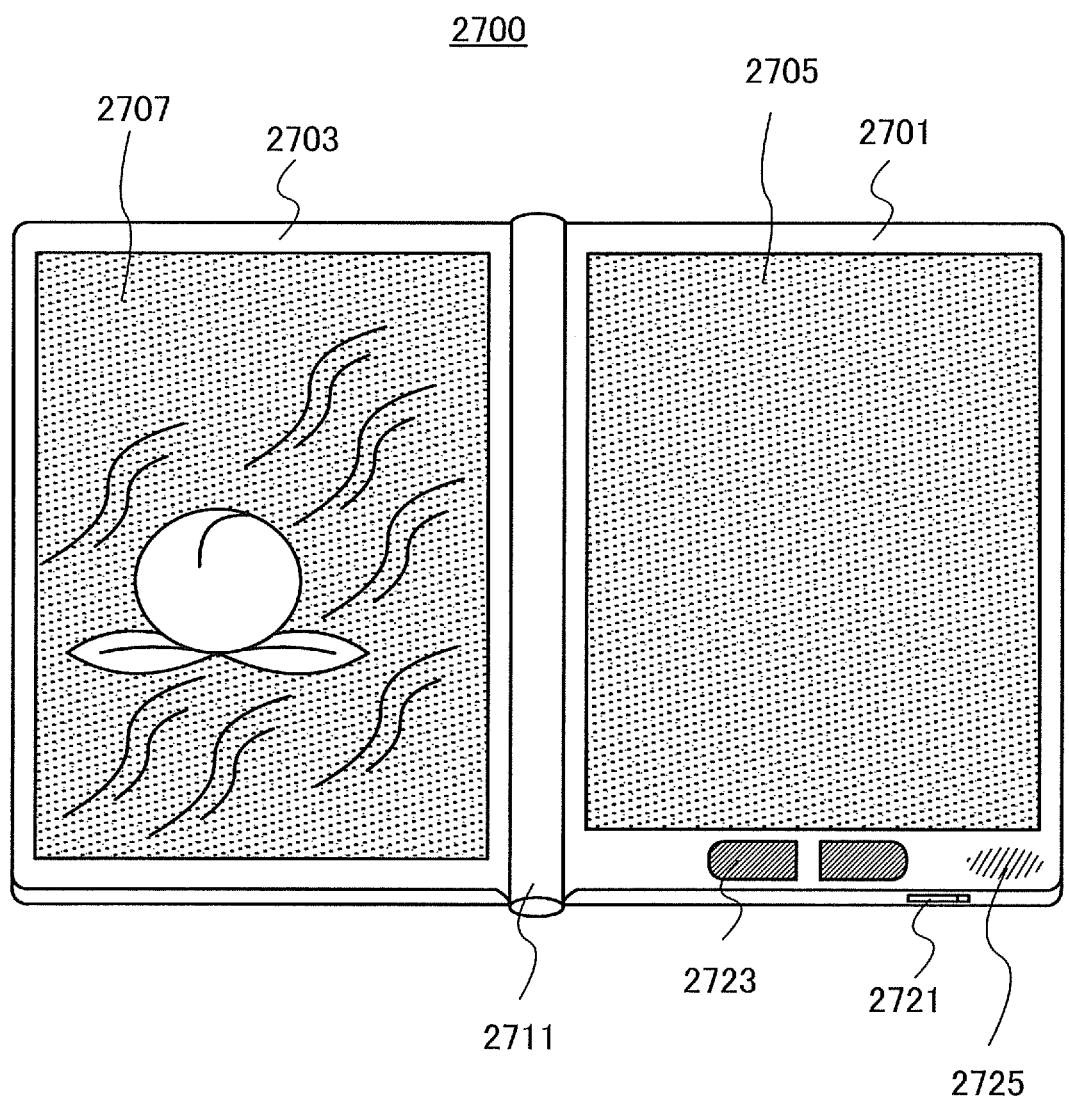
FIG. 23 is an external view illustrating an example of an electronic book.

FIG. 23 illustrates an example of an electronic book 2700. For example, the electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 23) and graphics can be displayed on a display portion on the left side (the display portion 2707 in FIG. 23).

FIG. 23 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal which can be connected to various cables such as an AC adapter and a USB cable, or the like), a recording medium insertion portion, and the like may be provided on the back surface or the side surface of the housing. Moreover, the electronic book 2700 may have a function of an electronic dictionary.

The electronic book 2700 may have a configuration capable of wirelessly transmitting and receiving data. Through wireless communication, desired book data or the like can be purchased and downloaded from an electronic book server.

(Embodiment 10)

The semiconductor devices each including a transistor, which are described in the above embodiments, can be applied to a variety of electronic devices (including amusement machines). Examples of electronic devices include television sets (also referred to as televisions or television receivers), monitor of computers or the like, cameras such as digital cameras or digital video cameras, digital photo frames, cellular phones (also referred to as mobile phones or cellular phone sets), portable game consoles, portable information terminals, audio reproducing devices, large-sized game machines such as pachinko machines, and the like.

Figure 24A:
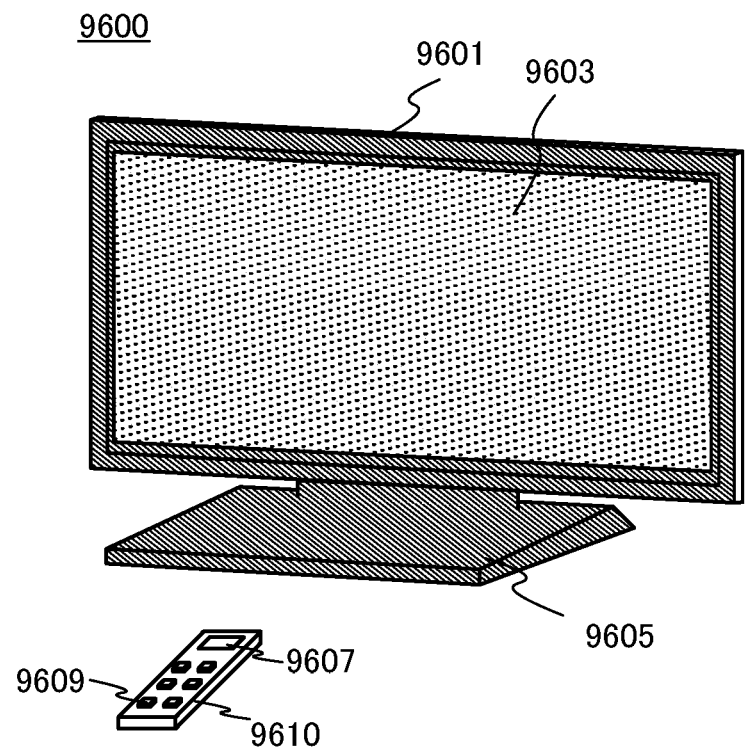
FIGS. 24A and 24B are external views illustrating examples of a television set and a digital photo frame.

FIG. 24A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller

9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 24B:
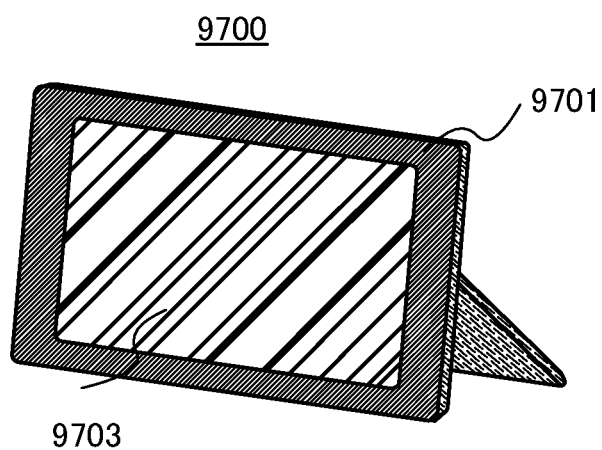

FIG. 24B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection terminal (a USB terminal, a terminal which can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 25A:
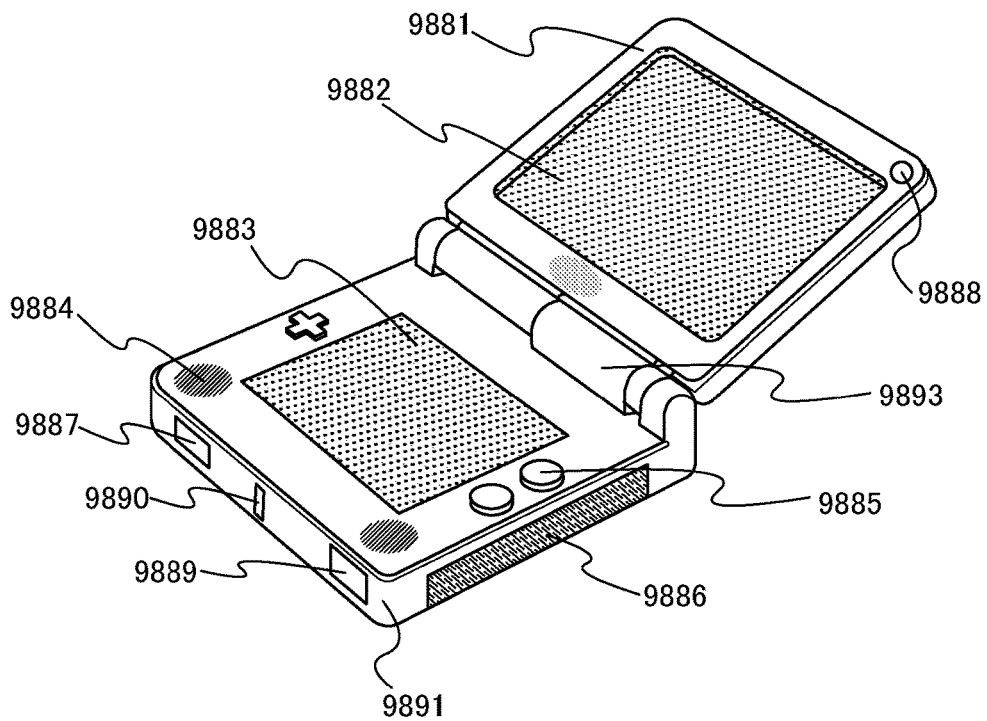
FIGS. 25A and 25B are external views illustrating examples of amusement machines.

FIG. 25A illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 25A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device can be employed. The portable amusement machine may include other accessory equipment as appropriate. The portable amusement machine illustrated in FIG. 25A has a function of reading a program or data stored in a recording medium to display it on the display portion, and a function of sharing information with another portable amusement machine by wireless communication. The portable amusement machine illustrated in FIG. 25A can have various functions without limitation to the above.

Figure 25B:
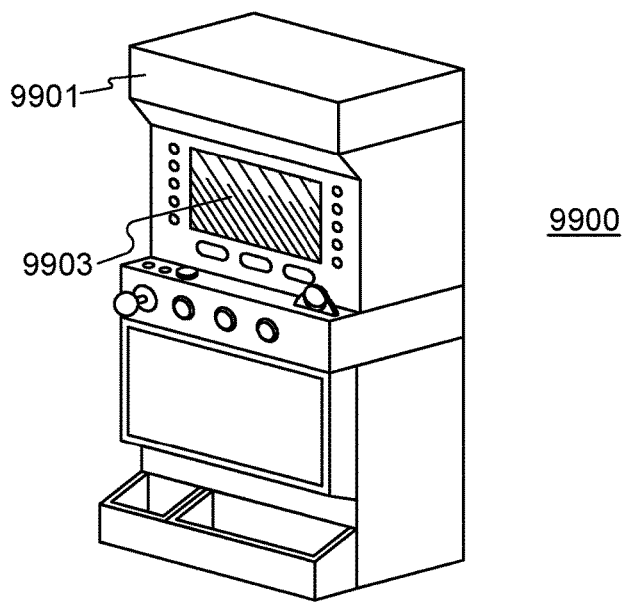

FIG. 25B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above structure and other structures provided with at least a semiconductor device may be employed. The slot machine 9900 may include other accessory equipment as appropriate.

Figure 26A:
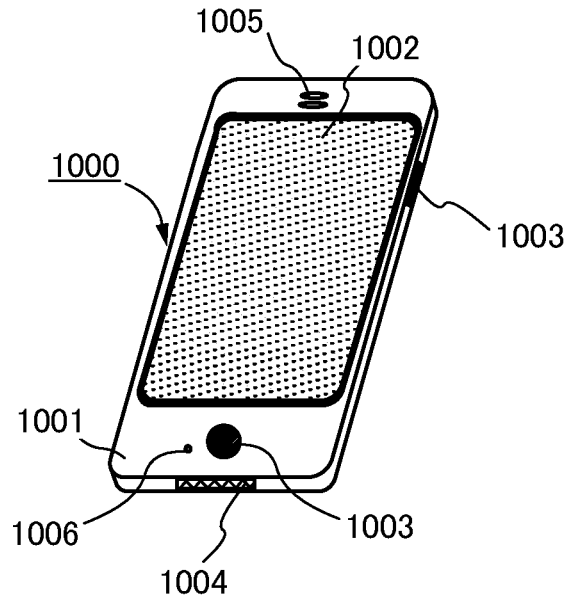
FIGS. 26A and 26B are external views illustrating examples of cellular phones.

FIG. 26A illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 26A is touched with a finger or the like, data can be input into the cellular phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In this case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically).

The screen mode is switched by touching the display portion 1002 or operating the operation buttons 1003 of the housing 1001. Alternatively, the screen mode may be switched depending on the kind of images displayed on the display portion 1002. For example, when a signal of an image displayed on the display portion is the one of moving image data, the screen mode is switched to the display mode. When the signal is the one of text data, the screen mode is switched to the input mode.

Furthermore, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 26B:
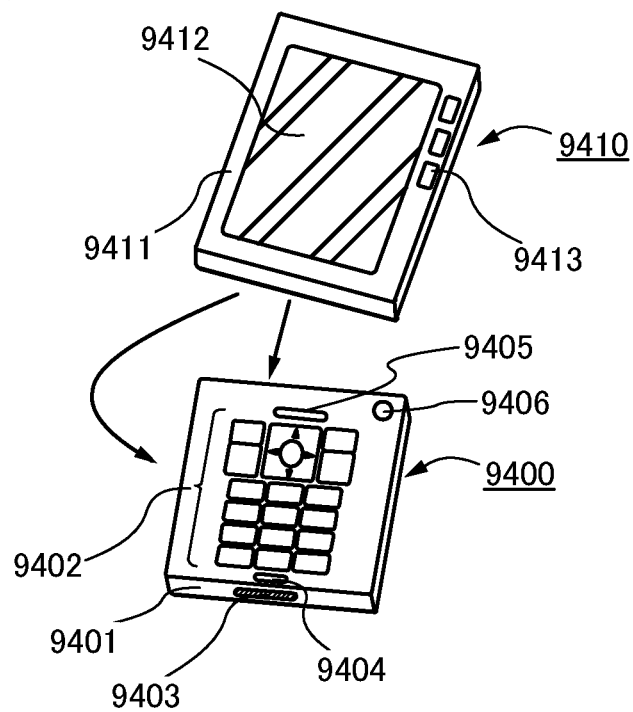

FIG. 26B illustrates another example of a cellular phone. The cellular phone in FIG. 26B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 which emits light when a phone call is received. The display device 9410 which has a display function can be detached from or attached to the communication device 9400 which has a phone function by moving in two directions represented by the allows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

This application is based on Japanese Patent Application serial no. 2008-323725 filed with Japanese Patent Office on Dec. 19, 2008, the entire contents of which are hereby incorporated by reference.

The invention claimed is:

1. A method for manufacturing a semiconductor device comprising the steps of:
   forming an electrode over a substrate;
   forming an insulating layer over the electrode;
   forming an oxide semiconductor layer over the insulating layer;
   forming a layer selectively so as to leave a part of the layer overlapping with a second region of the oxide semiconductor layer, and so as to expose a first region of the oxide semiconductor layer; and
   performing an oxidizing treatment to the oxide semiconductor layer, thereby a concentration of hydrogen included in the first region of the oxide semiconductor layer is lower than a concentration of hydrogen included in the second region of the oxide semiconductor layer by using a hydrogen absorption layer in contact with the first region of the oxide semiconductor layer,
   wherein the electrode overlaps with the first region of the oxide semiconductor layer.

2. The method for manufacturing a semiconductor device according to claim 1, wherein the layer comprises a material selected from the group consisting of a silicon nitride, a silicon nitride oxide, a silicon oxide, a silicon oxynitride, an aluminum oxide, an aluminum nitride, an aluminum oxynitride, a titanium oxide, a tantalum oxide, a titanium nitride and a tantalum nitride.

3. The method for manufacturing a semiconductor device according to claim 1, wherein the oxide semiconductor layer comprises indium.

4. The method for manufacturing a semiconductor device according to claim 1, wherein concentration gradient of hydrogen is formed between the first region and the second region.

5. The method for manufacturing a semiconductor device according to claim 1, wherein the layer is a hydrogen barrier layer.

6. The method for manufacturing a semiconductor device according to claim 1, wherein the concentration of hydrogen included in the first region of the oxide semiconductor layer and the concentration of hydrogen included in the second region of the oxide semiconductor layer are measured by secondary ion mass spectrometry.

7. The method for manufacturing a semiconductor device according to claim 1, wherein the concentration of hydrogen included in the first region of the oxide semiconductor layer is greater than or equal to $1\times10^{16}$ atoms/cm$^3$ and less than or equal to $1\times10^{21}$ atoms/cm$^3$.

8. A method for manufacturing a semiconductor device comprising the steps of:
   forming a first electrode over a substrate;
   forming an insulating layer over the first electrode;
   forming an oxide semiconductor layer over the insulating layer;
   forming a layer selectively so as to leave a part of the layer overlapping with a second region of the oxide semiconductor layer, and so as to expose a first region of the oxide semiconductor layer;
   performing an oxidizing treatment to the oxide semiconductor layer, thereby a concentration of hydrogen included in the first region of the oxide semiconductor layer is lower than a concentration of hydrogen included in the second region of the oxide semiconductor layer by using a hydrogen absorption layer in contact with the first region of the oxide semiconductor layer; and
   forming a pair of second electrodes over the insulating layer,
   wherein the first electrode overlaps with the first region of the oxide semiconductor layer, and
   wherein the pair of the second electrodes are in contact with the second region of the oxide semiconductor layer.

9. The method for manufacturing a semiconductor device according to claim 8, wherein the layer comprises a material selected from the group consisting of a silicon nitride, a silicon nitride oxide, a silicon oxide, a silicon oxynitride, an aluminum oxide, an aluminum nitride, an aluminum oxynitride, a titanium oxide, a tantalum oxide, a titanium nitride and a tantalum nitride.

10. The method for manufacturing a semiconductor device according to claim 8, wherein the oxide semiconductor layer comprises indium.

11. The method for manufacturing a semiconductor device according to claim 8, wherein concentration gradient of hydrogen is formed between the first region and the second region.

12. The method for manufacturing a semiconductor device according to claim 8, wherein the layer is a hydrogen barrier layer.

13. The method for manufacturing a semiconductor device according to claim 8, wherein the concentration of hydrogen included in the first region of the oxide semiconductor layer and the concentration of hydrogen included in the second region of the oxide semiconductor layer are measured by secondary ion mass spectrometry.

14. The method for manufacturing a semiconductor device according to claim 8, wherein the concentration of hydrogen included in the first region of the oxide semiconductor layer is greater than or equal to $1\times10^{16}$ atoms/cm$^3$ and less than or equal to $1\times10^{21}$ atoms/cm$^3$.

15. The method for manufacturing a semiconductor device according to claim 8, wherein the first electrode is a gate electrode.

16. The method for manufacturing a semiconductor device according to claim 8, wherein the pair of the second electrodes are source and drain electrodes.

* * * * *